United States Patent [19]

Veneski et al.

[11] Patent Number: 4,575,794
[45] Date of Patent: Mar. 11, 1986

[54] CLOCKING MECHANISM FOR MULTIPLE OVERLAPPED DYNAMIC PROGRAMMABLE LOGIC ARRAYS USED IN A DIGITAL CONTROL UNIT

[75] Inventors: Gerard A. Veneski; Nandor G. Thoma, both of Boca Raton; Moises Cases, Delray Beach, all of Fla.

[73] Assignee: International Business Machines Corp., Armonk, N.Y.

[21] Appl. No.: 350,683

[22] Filed: Feb. 22, 1982

[51] Int. Cl.[4] ............................ G06F 9/28; G06F 9/26
[52] U.S. Cl. ................................... 364/200; 307/465; 364/900
[58] Field of Search ... 364/200 MS File, 900 MS File; 307/445, 465

[56] References Cited

U.S. PATENT DOCUMENTS

| | | | |
|---|---|---|---|
| 3,959,774 | 5/1976 | Mead | 364/200 |
| 4,168,523 | 9/1979 | Chari et al. | 364/200 |
| 4,173,041 | 10/1979 | Dvorak et al. | 364/200 |
| 4,236,207 | 11/1980 | Rado et al. | 364/200 |
| 4,254,461 | 3/1981 | Chemla et al. | 364/200 |
| 4,434,461 | 2/1984 | Puhl | 364/200 |
| 4,509,114 | 4/1985 | Leininger et al. | 364/200 |
| 4,519,033 | 5/1985 | Vaughn et al. | 364/200 |

OTHER PUBLICATIONS

Mano, M. Morris, *Digital Logic and Computer Design* Prentice Hall, Inc., Englewood Cliffs, NJ, 1979, pp. 189-191, 443-446.

*Primary Examiner*—James R. Hoffman
*Attorney, Agent, or Firm*—Richard E. Bee

[57] ABSTRACT

A clocking mechanism is provided for multiple overlapped dynamic programmable logic arrays which are used in a digital control unit wherein a sequence of control words are used to produce successive groups of control point signals. Such a control unit includes a plurality of dynamic programmable logic arrays for individually producing different ones of the control words. Each such control word includes a strobe field which is coded to identify a programmable logic array other than the one which produced it. The control unit also includes control circuitry responsive to the control words for producing the control point signals for successive machine control cycles. The control circuitry includes circuitry responsive to the strobe field in each control word for producing a strobe signal for selecting the next programmable logic array to supply a control word to the control circuitry. This control unit further includes clocking circuitry resposive to the strobe signals produced by the control circuitry for producing clocking signals for the dynamic programmable logic arrays. Such clocking circuitry includes only combinatorial logic circuitry for producing the clocking signals.

22 Claims, 43 Drawing Figures

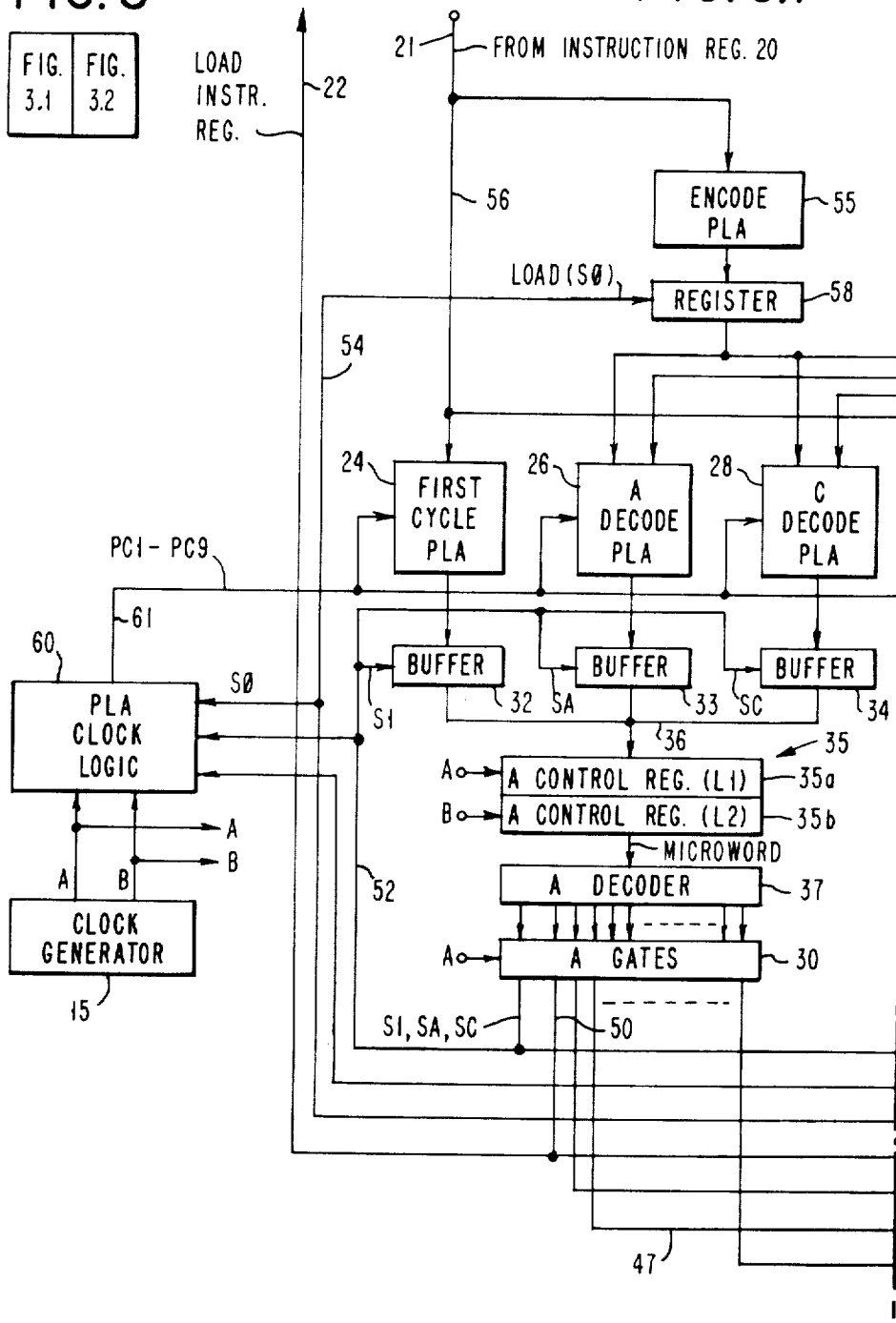

FIG. 3.2
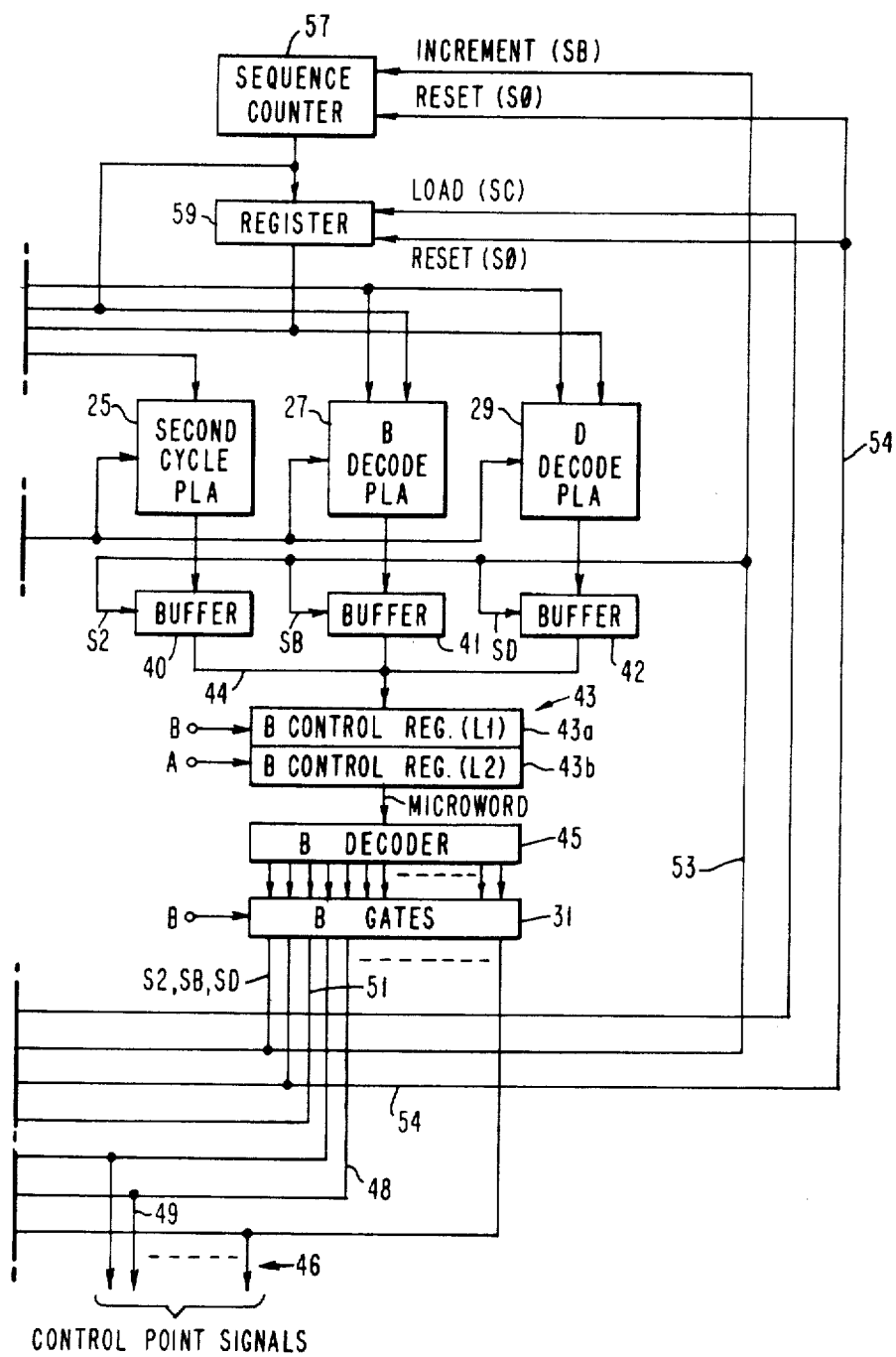

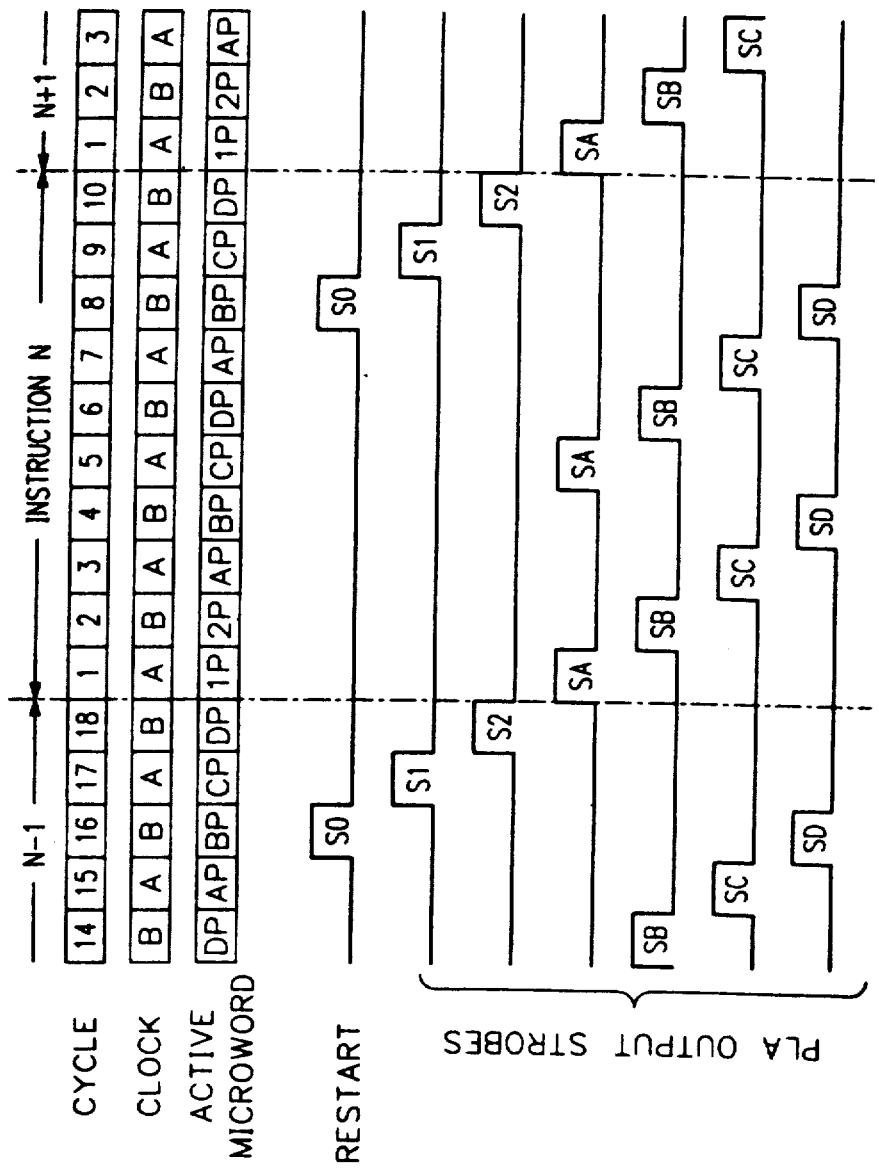
FIG. 4.1

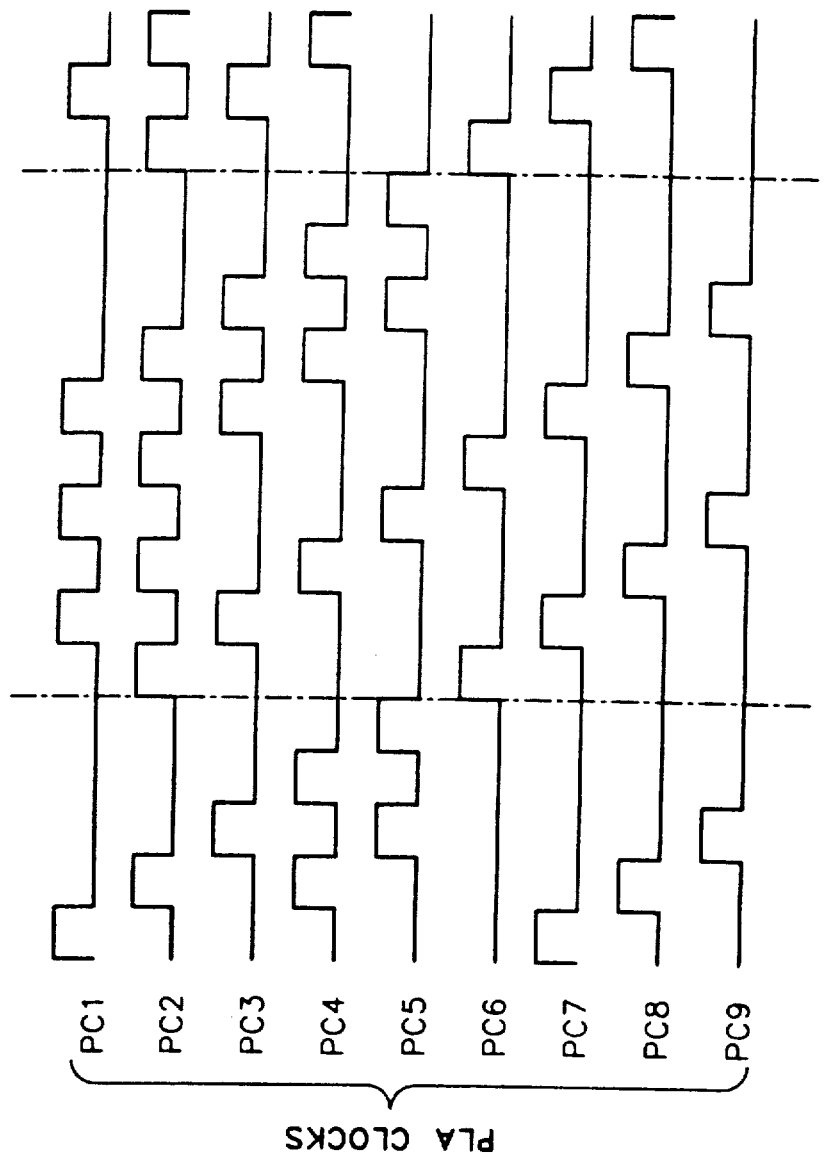
FIG. 4.2

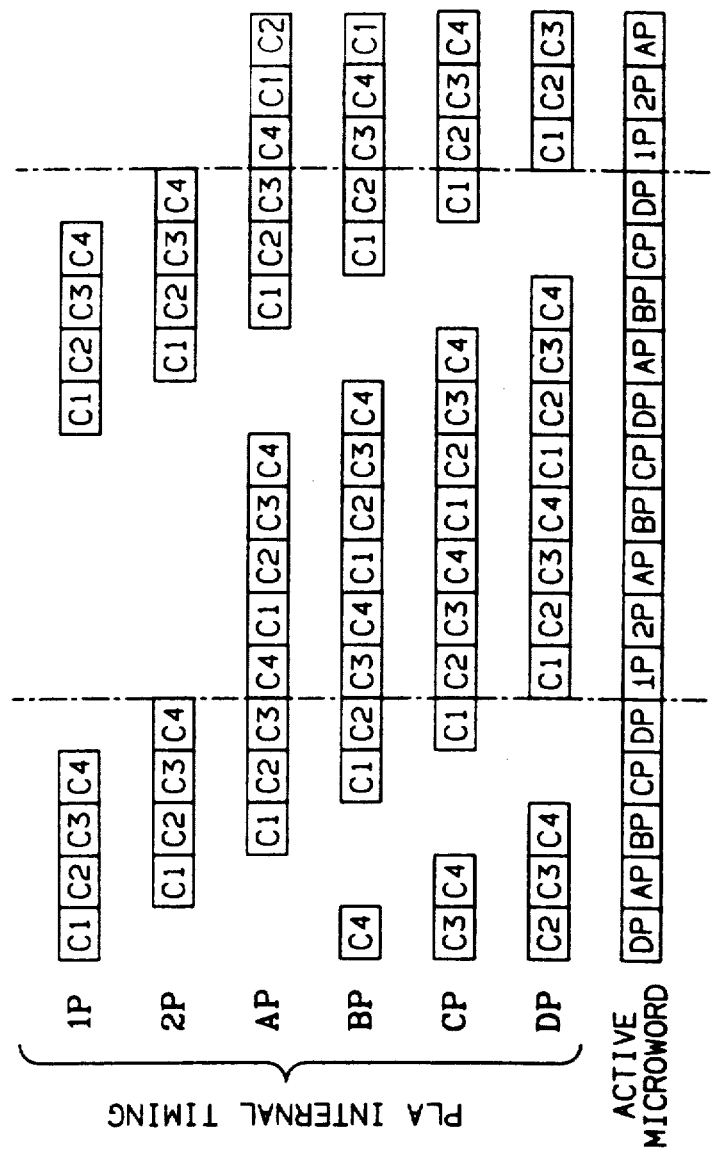
FIG. 4.3

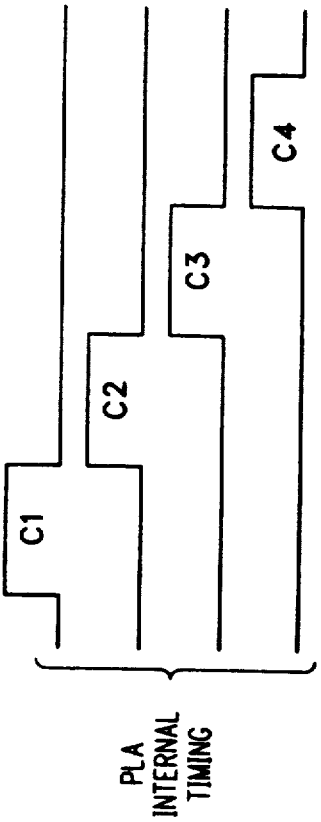

FIG. 8

| CLOCK | FUNCTIONS |
|---|---|
| C1 | PRECHARGE AND ARRAY INPUT LINES |
| C2 | VALIDATE AND ARRAY INPUT LINES PRECHARGE PRODUCT LINES |
| C3 | VALIDATE PRODUCT LINES PRECHARGE OR ARRAY OUTPUT LINES |
| C4 | VALIDATE OR ARRAY OUTPUT LINES |

FIG. 5

| PLA | OUTPUT STROBE | C1 | C2 | C3 | C4 |
|---|---|---|---|---|---|
| 1st. CYCLE | S1 | PC1 | PC2 | PC3 | PC4 |
| 2nd. CYCLE | S2 | PC2 | PC3 | PC4 | PC5 |
| A DECODE | SA | PC3 | PC4 | PC5 | PC6 |
| B DECODE | SB | PC4 | PC5 | PC6 | PC7 |
| C DECODE | SC | PC5 | PC6 | PC7 | PC8 |
| D DECODE | SD | PC6 | PC7 | PC8 | PC9 |

FIG. 7

PLA INTERNAL TIMING

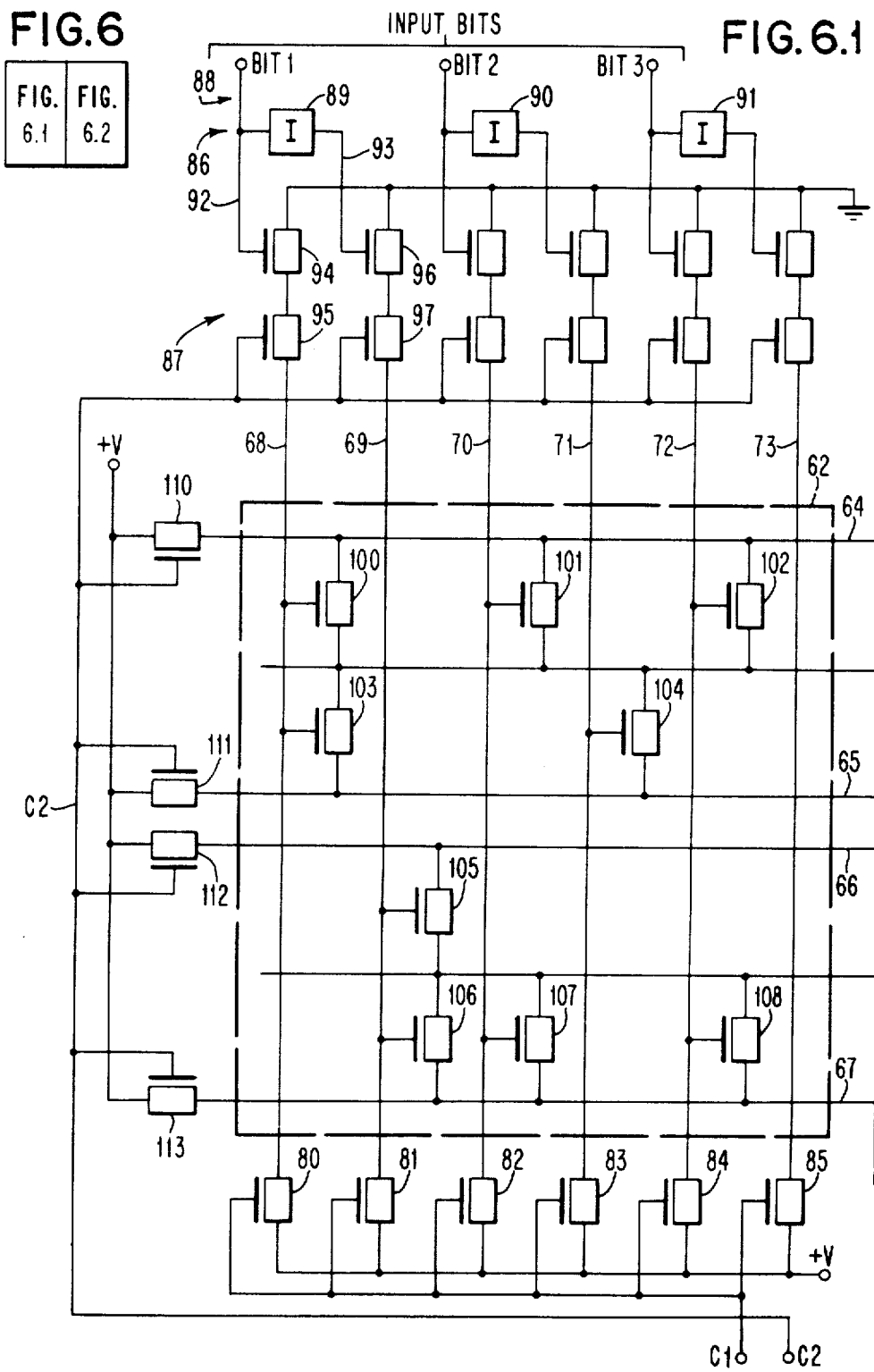

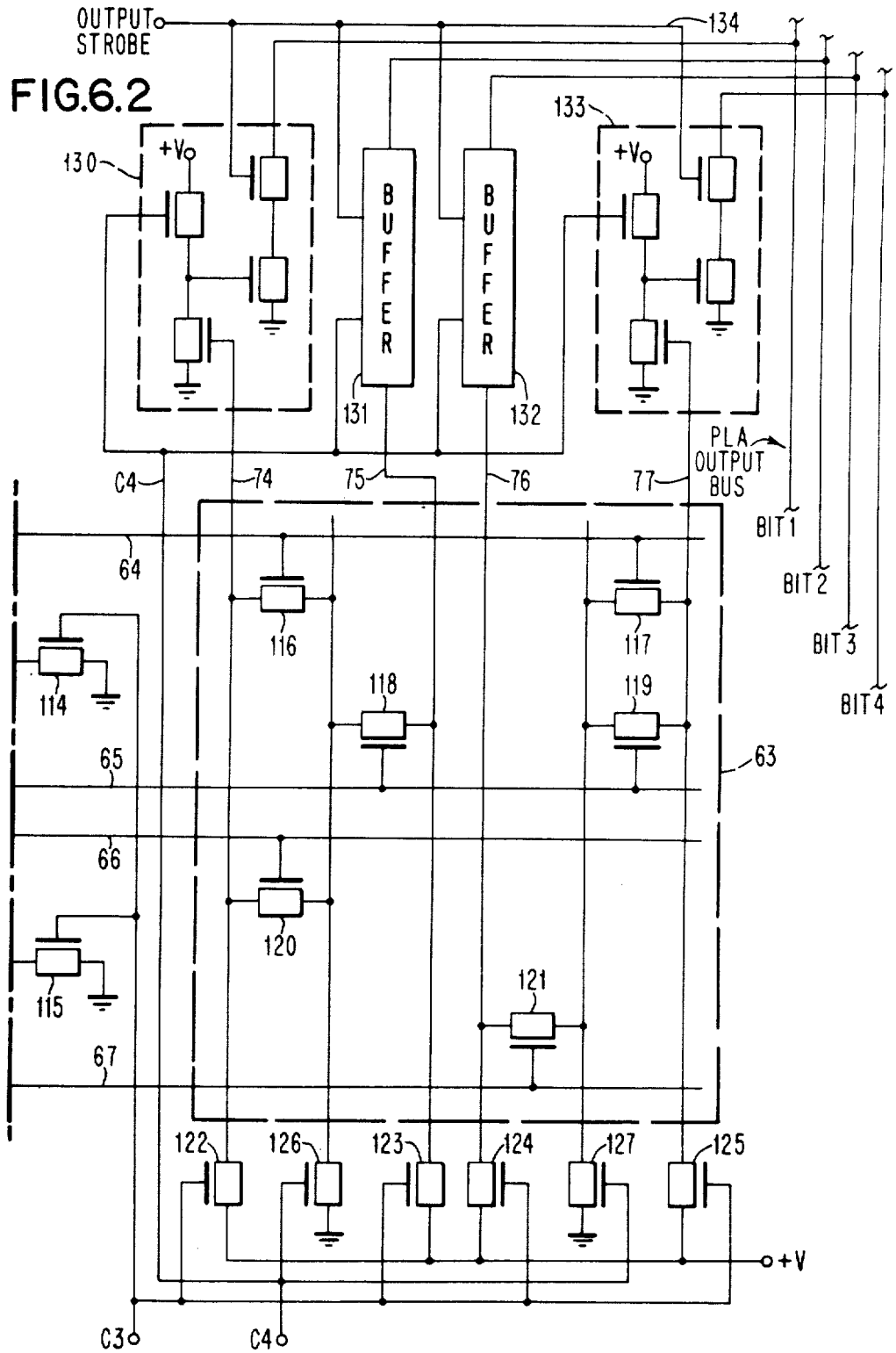
FIG.6.2

FIG. 10.1

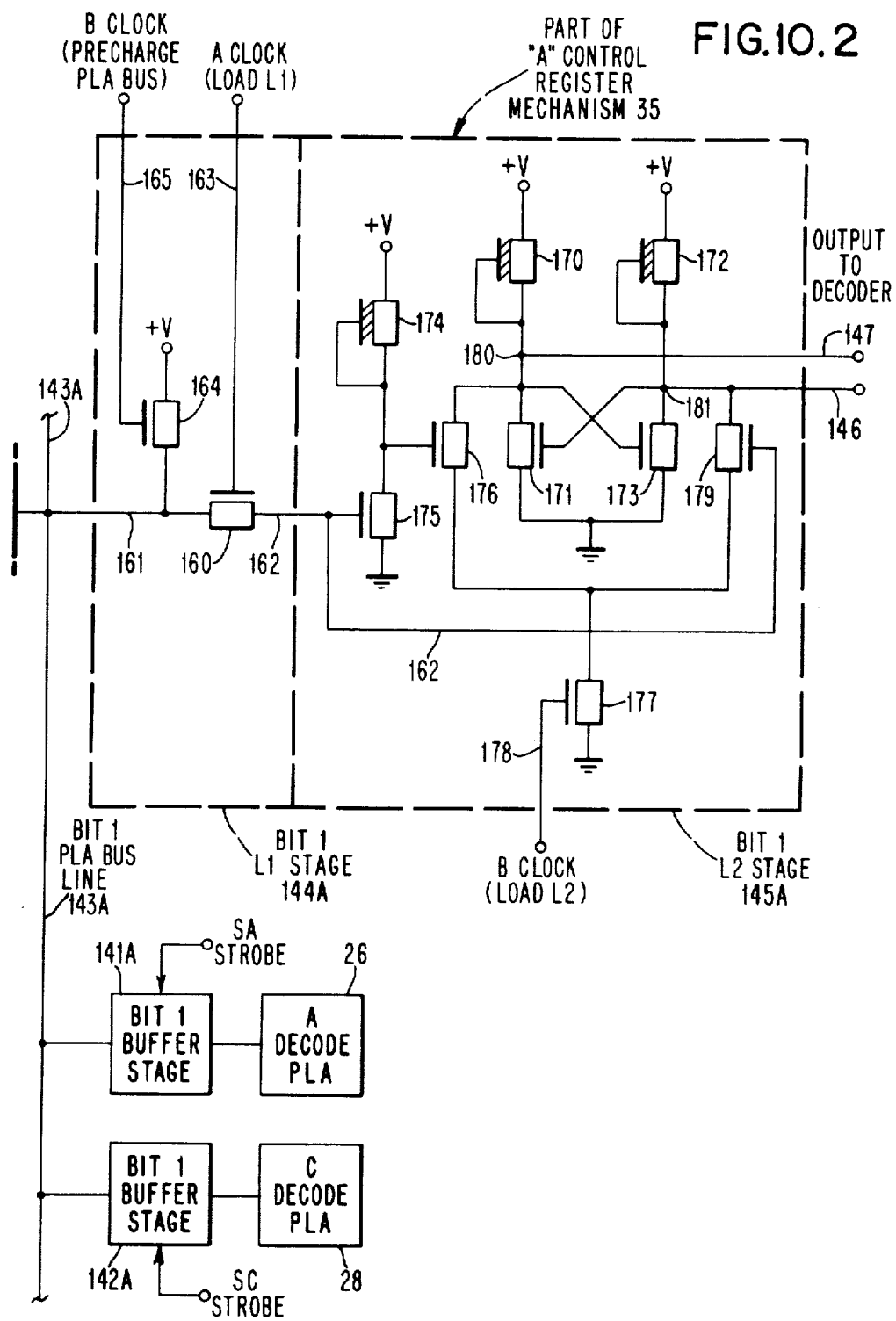
FIG.10.2

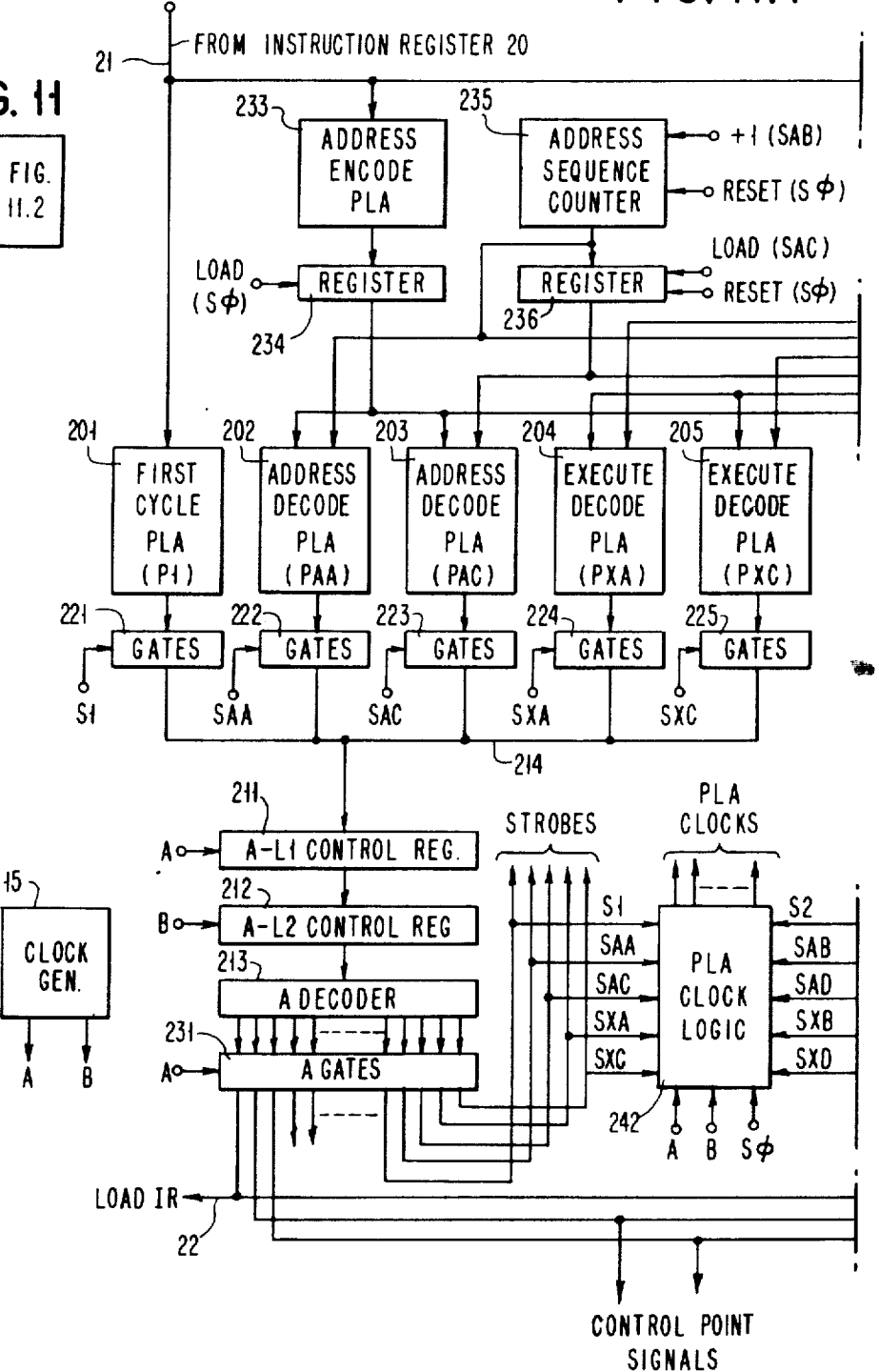

FIG. 11.2
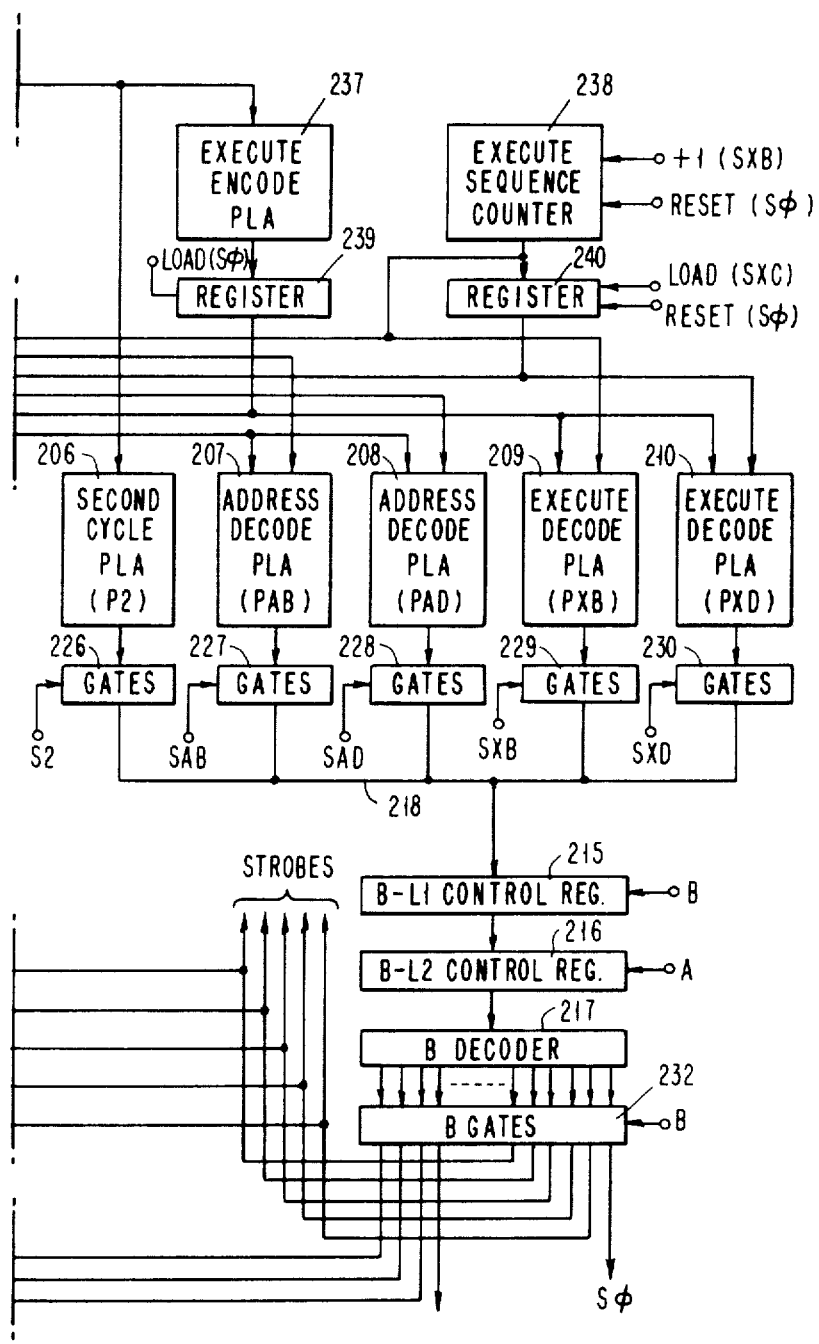

| PLA | OUTPUT STROBE | C1 | C2 | C3 | C4 |
|-----|---------------|------|------|------|------|
| P1  | S1            | PC1  | PC2  | PC3  | PC4  |
| P2  | S2            | PC2  | PC3  | PC4  | PC5  |
| PAA | SAA           | PC3  | PC4  | PC5  | PC6  |
| PAB | SAB           | PC4  | PC5  | PC6  | PC7  |
| PAC | SAC           | PC5  | PC6  | PC7  | PC8  |
| PAD | SAD           | PC6  | PC7  | PC8  | PC9  |
| PXA | SXA           | PC10 | PC11 | PC12 | PC13 |
| PXB | SXB           | PC11 | PC12 | PC13 | PC14 |
| PXC | SXC           | PC12 | PC13 | PC14 | PC15 |
| PXD | SXD           | PC13 | PC14 | PC15 | PC16 |

FIG. 13

| PLA CLOCK | AB CLOCK | PLA CLOCK LOGIC |
|---|---|---|
| PC1 | B | $B \cdot \overline{S\phi} \cdot \overline{S2}$ |
| PC2 | A | $A \cdot \overline{S1}$ |
| PC3 | B | $S\phi + SAB$ |
| PC4 | A | $S1 + SAC$ |
| PC5 | B | $S2 + SAD$ |
| PC6 | A | SAA |
| PC7 | B | SAB |
| PC8 | A | SAC |
| PC9 | B | SAD |
| PC10 | B | $S2 + SAB + SAD + SXB$ |
| PC11 | A | $SAA + SAC + SXC$ |
| PC12 | B | $SAB + SAD + SXD$ |
| PC13 | A | SXA |
| PC14 | B | SXB |
| PC15 | A | SXC |
| PC16 | B | SXD |

# 4,575,794

CLOCKING MECHANISM FOR MULTIPLE OVERLAPPED DYNAMIC PROGRAMMABLE LOGIC ARRAYS USED IN A DIGITAL CONTROL UNIT

DESCRIPTION

Cross-Reference To Related Applications

The present patent application is related to the following copending United States patent applications:

(1) Application Ser. No. 350,660, filed Feb. 22, 1982, entitled "Microword Control System Utilizing Multiplexed Programmable Logic Arrays", the inventors being Victor S. Moore et al;

(2) Application Ser. No. 350,662, filed Feb. 22, 1982, entitled "Microword Control Mechanism Utilizing A Programmable Logic Array And A Sequence Counter", the inventors being Joel C. Leininger et al, now U.S. Pat. No. 4,509,114, granted Apr. 2, 1985;

(3) Application Ser. No. 350,663, filed Feb. 22, 1982, entitled "Microword Generation Mechanism Utilizing Separate Programmable Logic Arrays For First And Second Microwords", the inventors being Joseph C. Rhodes, Jr. et al;

(4) Application Ser. No. 334,185, filed Dec. 24, 1981, entitled "Large Scale Integration Data Processor Signal Transfer Mechanism", the inventors being Virgil D. Wyatt et al;

(5) Application Ser. No. 350,682, filed Feb. 22, 1982, entitled "Microcode Control Mechanism Utilizing Programmable Microcode Repeat Counter", the inventors being Tony E. Parker et al; and (6) Application Ser. No. 350,681, filed Feb. 22, 1982, entitled "Integrated Circuit Mechanism For Coupling Multiple Programmable Logic Arrays To A Common Bus", the inventors being Wayne R. Kraft et al.

The descriptions set forth in these copending applications are hereby incorporated in the present application by this reference thereto.

TECHNICAL FIELD

This invention relates to clocking mechanisms for dynamic programmable logic arrays used in digital controllers, digital data processors and digital control systems. This invention is particularly useful where multiple dynamic programmable logic arrays are operated in an overlapped manner.

BACKGROUND ART

Dynamic programmable logic arrays (PLA's) are useful in the digital computer arts and in the digital control system arts for solving various logical relationships and providing various manufacturing and process control functions at reduced power dissipation and increased throughput performance. A dynamic programmable logic array (PLA) is sometimes referred to as a "clocked" PLA. A dynamic PLA requires a set of consecutive clocking pulses to be applied to it in order to produce a valid output. It is necessary to do this to obtain a valid output each time the input signal conditions for the PLA are changed. This is sometimes referred to as "validation" of the PLA output. In a typical example, four consecutive clocking pulses are required to obtain a valid output.

If a dynamic PLA is allowed to remain idle (no clocking pulses for validation purposes), the capacitive output stages of the PLA will begin to discharge. If this idle condition continues for a relatively long period of time, on the order of several microseconds, the output stages of the PLA will have discharged sufficiently so that the output data is no longer reliable. If the period of time since the last validation of the PLA output starts to become excessive, loss of output data can be prevented by supplying a set of consecutive clocking pulses to the PLA for purposes of refreshing the PLA output. So long as the PLA remains idle, it must be refreshed at periodic intervals to prevent loss of data.

A straightforward approach to generating the reoccurring sets of clocking pulses for a dynamic PLA would be to employ a hardware counter and the appropriate sequential control circuitry for generating a set of clocking pulses when requested for validation purposes or when needed for refresh purposes. The counter could be employed to count the number of pulses allowed to issue from a clock pulse source or, alternatively, a clock pulse source could be used to drive the counter with appropriate decoding circuitry being coupled to the output of the counter for producing the desired set of clocking pulses. In either case, the circuitry for producing the reoccurring sets of clocking pulses must include means for starting and stopping the production of the clocking pulses and means for synchronizing the production of the clocking pulses with the operation of the remainder of the system.

A digital control unit of considerably improved performance can be provided by using multiple dynamic PLA's wherein the validation intervals for the PLA's are overlapped to produce valid PLA output signals at a faster rate than would be the case for a single PLA. In this case, multiple sets of consecutive clocking pulses are needed to validate the different ones of the multiple dynamic PLA's. In general, the clocking pulse generation conditions are unique and different for each of the multiple PLA's. This would require the use of several hardware counters, each with its associated start/stop and synchronization problems, these problems being characteristic of sequential type circuits.

While useful in some applications, this multiple counter approach has various drawbacks. For one thing, this multiple counter circuitry is relatively expensive to build because of its complexity and its sequential circuit problems. Also, it is not easily adaptable to logic design changes.

SUMMARY OF INVENTION

The use of multiple programmable logic arrays (PLA's) to provide a high-performance digital control unit is described and claimed in the above-referenced patent application Ser. No. 350,660 of Victor S. Moore et al. The present invention provides an improved PLA clocking mechanism for the case where the multiple PLA's are dynamic PLA's.

In a digital control unit or control system of the type being considered herein, a sequence of control words or microwords are used to produce successive groups of control point signals for providing the desired elementary control actions. When multiple PLA's are used, the different PLA's individually produce different ones of the control words or microwords. The control unit or control system includes control circuitry which is responsive to these control words for producing the desired control point signals for successive control cycles. Each control word or microword produced by each PLA includes a strobe field which is coded to identify a PLA other than the one which produced it. The control circuitry includes circuitry responsive to the strobe field in each control word for producing a strobe control point signal for selecting the next PLA which is allowed to supply a control word or microword to the control circuitry. These PLA strobe signals are used to provide the multiplexing action which is needed for controlling the movement of the control words from the different PLA's to the control circuitry which produces the control point signals.

A basic conception of the present invention is that these PLA strobe signals can also be used to produce the internal PLA clocking pulses for the case where the PLA's are dynamic PLA's. A further conception of the present invention is that this can be accomplished by means of relatively simple combinatorial logic circuitry, as opposed to the relatively complicated sequential logic using hardware counters as discussed above. In particular, since a PLA strobe pulse is produced for each system control cycle, the PLA clocking pulses for each of the various dynamic PLA's can be defined from the correct Boolean combination of different ones of the PLA strobe pulses. The result is that the various sets of PLA clocking pulses for the various dynamic PLA's can be generated by means of a reasonably small number of AND and OR type combinatorial logic circuits.

The use of only combinatorial logic circuits to produce the internal clocking pulses for the dynamic PLA's eliminates the need for realtively expensive hardware counters. It also eliminates the start/stop and synchronization problems associated with the hardware counter approach. Thus, the cost and complexity of the control unit is reduced. Also, the use of combinatorial logic circuitry for this purpose makes it relatively easy to implement logical design changes. A further and significant advantage also occurs for the case where the control unit is to be fabricated on a large scale integration (LSI) type integrated circuit chip. The combinatorial logic circuitry requires significantly less area on the chip.

As used herein, the terms "control word" and "microword" are intended to have one and the same meaning. These terms are used interchangeably herein. A control word or microword is a basic or elementary machine language instruction which is used in a sequence with other such control words or microwords to cause the occurrence of the elementary machine actions in a digital computer, a digital control system or the like. It is a multiple-bit binary word which is used to define the control point signals which are to be activated for one elementary control cycle or microword cycle.

For a better understanding of the present invention, together with other and further advantages and features thereof, reference is made to the following description taken in connection with the accompanying drawings, the scope of the invention being pointed out in the appended claims.

BRIEF DESCRIPTION OF THE DRAWINGS

Referring to the drawings:

FIGS. 3.1 and 3.2, when combined in the manner shown in FIG. 3, provide a functional block diagram of a first embodiment of a digital control unit which is constructed in accordance with the present invention and which may be used to provide the data processor control unit of FIG. 1;

FIGS. 4.1, 4.2 and 4.3, when placed one below the other, provide a timing diagram (collectively referred to as FIG. 4) used in explaining the operation of the control unit of FIG. 3;

FIG. 5 is a chart used in explaining the clocking pulse timings for the various dynamic programmable logic arrays (PLA's) of FIG. 3;

FIGS. 6.1 and 6.2, when combined in the manner shown in FIG. 6, show in greater detail a representative form of construction for each of the dynamic programmable logic arrays (PLA's) of FIG. 3;

FIG. 7 is a timing diagram used in explaining the operation of the programmable logic array (PLA) of FIG. 6;

FIG. 8 is a chart used in explaining the operation of the PLA of FIG. 6;

FIGS. 11.1 and 11.2, when combined in the manner shown in FIG. 11, provide a functional block diagram of a second embodiment of a digital control unit which is constructed in accordance with the present invention and which may be used to provide the computer control unit of FIG. 1;

FIG. 13 is a chart used in explaining the internal construction of the PLA clock logic circuitry of FIG. 11;

DESCRIPTION OF THE FIG. 1 DATA PROCESSOR

Figure 1:
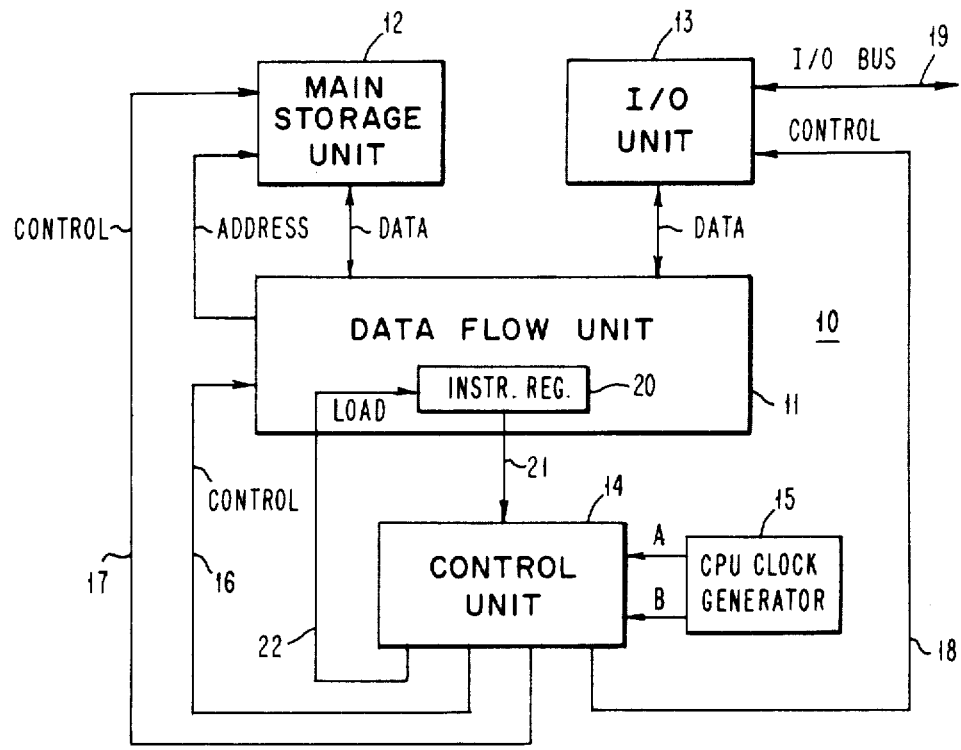
FIG. 1 is a functional block diagram of a digital data processor or digital computer wherein the present invention may be used to good advantage.

Referring to FIG. 1, there is shown a functional block diagram of a digital computer or digital data processor 10 which is particularly suitable for fabrication on large scale integration (LSI) type integrated circuit chips. This data processor 10 includes a data flow unit 11, a main storage unit 12, and input/output (I/O) unit 13, a control unit 14 and a CPU (central processing unit) clock generator 15. The data flow unit 11 is sometimes called a central processing unit (CPU) and includes such things as an arithmetic and logic unit (ALU), various hardware registers and counters, a local storage unit and a bus system interconnecting these items with one another. The data flow unit 11 is the unit that does the adding, subtracting, rearranging and other manipulation of the data to produce the desired results.

The control unit 14 controls the operation of the data flow unit 11, the main storage unit 12, and the I/O unit 13 by means of various control point signals which are supplied by way of respective multiline control buses 16, 17 and 18 to the various functional elements located in these units 11, 12 and 13. Control unit 14 includes a microword generation mechanism for producing a sequence of microwords for each processor instruction to be executed. These microwords, in turn, produce the control point signals which control the elemental operations in the other data processor units.

The data flow unit 11, the I/O unit 13 and the control unit 14 can all be fabricated on one and the same integrated circuit chip.

The user program to be performed by the data processor 10 is initially loaded into the main storage unit 12 from one of the peripheral units (not shown) coupled to the I/O unit 13 by way of an I/O bus 19. This initial loading is accomplished by way of the data flow unit 11. After such initial loading, the user program is performed by reading from the main storage unit 12 in a sequential manner the various processor instructions which make up the user program. Each processor instruction, in its turn, is read out of the main storage unit 12 and loaded into an instruction register 20 located in the data flow unit 11. The processor instruction resident in the instruction register 20, or at least the effective operation code portion thereof, is supplied to the control unit 14 by way of a multiline bus 21 to identify to the control unit 14 the particular processor instruction to be executed.

In some processors, only a portion of the complete processor instruction may be loaded into the instruction register 20. In such cases, the portion loaded into the instruction register 20 includes at least the "effective" operation code portion of the instruction. By "effective" operation code is meant all the bits in the processor instruction which are needed to uniquely define the kind of operation to be performed by the processor instruction. This does not include operand address bits and length count bits but does include function bits and modifier bits are needed to complete the definition of the operation to be performed.

Loading of a new processor instruction into the instruction register 20 is accomplished by way of a control point signal which is supplied by way of a control line 22 to a load control terminal of the instruction register 20.

Figure 2:
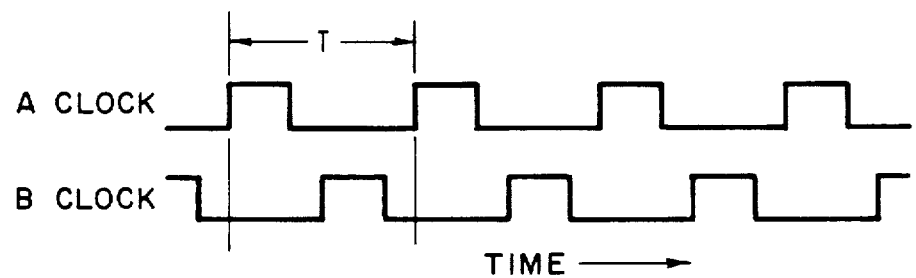
FIG. 2 is a timing diagram used in explaining the operation of the FIG. 1 data processor.

The timing of the operations taking place within the control unit 14 is controlled by the CPU clock generator 15. This clock generator 15 is a two-phase non-overlapping clock generator. It generates the A phase and the B phase clock signals shown in FIG. 2. Both of these clock signals are of the same frequency and have the same waveshape, the difference being that they are displaced in time relative to one another. The positive pulses of the A clock do not overlap with the positive pulses of the B clock. The amount of non-overlap shown in FIG. 2 is exaggerated for purposes of clarity. These positive pulses represent the active intervals for the two clock signals.

DESCRIPTION OF THE FIG. 3 CONTROL UNIT

Referring to FIGS. 3.1 and 3.2 (collectively referred to as FIG. 3), there is shown a functional block diagram of a first embodiment of a digital control system or control unit constructed in accordance with the present invention. This control unit of FIG. 3 may be used as the control unit 14 in the FIG. 1 data processor. All of the elements shown in FIG. 3, with the possible exception of some or all of the clock generator 15, are fabricated on the same LSI integrated circuit chip.

With reference to FIG. 3, the control unit there shown includes a microword control storage mechanism for producing the control words or microwords needed for executing each processor instruction. This control storage mechanism is provided by multiple programmable logic arrays (PLA's) 24–29 which are logically similar but physically separate elements. Each of these PLA's 24–29 includes one or more of the microwords needed to execute each processor instruction. The microwords are taken from the different PLA's in a time multiplexed or interleaved manner. The sequence for any given processor instruction is: 1P,2P, AP,BP,CP,DP,AP,BP,CP,DP,AP, BP, . . . 1P denotes a microword from the first cycle PLA 24, 2P denotes a microword from the second cycle PLA 25, AP denotes a microword from the A decode PLA 26, BP denotes a microword from the B decode PLA 27, CP denotes a microword from the C decode PLA 28 and DP denotes a microword from the D decode PLA 29.

The first microword for each processor instruction is provided by the first cycle PLA 24, while the second microword for each processor instruction is provided by the second cycle PLA 25. The remaining microwords for any given processor instruction are provided by the A, B, C and D decode PLA's 26–29. The AP,BP,CP,DP sequence is repeated as many times as is necessary to accomplish the execution of a given processor instruction. Some processor instructions will require only a few microwords, while others will require a relatively large number of microwords. In general, the A decode PLA 26 will include a plurality of different microwords for each processsor instruction. Similar considerations apply for the B,C and D decode PLA's 27–29. The first and second cycle PLA's 24 and 25, on the other hand, will include only one microword for each processor instruction.

As will be seen, each of the PLA's 24–29 is of the dynamic or clocked type. Dividing the microwords between multiple PLA's serves to improve the performance speed of the control unit 14. For one thing, this keeps down the size of each individual PLA. As a general rule, the smaller the size of the PLA, the faster it can operate. A further improvement in performance speed is obtained because, as will be seen, the decoding actions in the individual PLA's are overlapped with one another.

Two levels of multiplexing or interleaving action are provided for the PLA's 24–29. A first level of multiplexing is provided by the use of A gates 30 (FIG. 3.1) and B gates 31 (FIG. 3.2). A gates 30 enable the microwords from the first cycle PLA 24, the A decode PLA 26 and the C decode PLA 28 to control the data processor 10 only during the positive pulse portions of the A clock signal. The B gates 31, on the other hand, enable the microwords from the second cycle PLA 25, the B decode PLA 27 and the D decode PLA 29 to control the data processor only during the positive pulse portions of the B clock signal. The time interleaving of these positive pulse portions is shown in FIG. 2. The PLA's 24,26 and 28 of FIG. 3.1 will sometimes be referred to herein as the "A clock" PLA's and the PLA's 25,27 and 29 of FIG. 3.2 will sometimes be referred to as the "B clock" PLA's, in keeping with the clock times during which their microwords control the data processor 10.

A second level of multiplexing for the "A clock" PLA's 24,26 and 28 is provided by PLA output buffers 32,33 and 34 which are separate output buffers for the PLA's 24,26 and 28, respectively. These buffers 32,33 and 34 are respectively controlled by separate strobe signal pulses appearing on the separate strobe signal lines S1,SA and SC. These strobe signal lines S1,SA and SC are activated one at a time in a sequential manner so that only one microword at a time is supplied to an A control register mechanism 35. This control register mechanism 35 is comprised of two registers connected in cascade one after the other. The first register is a Level 1 or L1 register 35a, followed by a Level 2 or L2 register 35b. The microwords which are passed one at a time by the buffers 32,33 and 34 are supplied to the input of the L1 register 35a by way of a PLA output bus 36. The microword appearing on the PLA bus 36 is loaded into the L1 register 35a by an A clock pulse from the clock generator 15. The microword residing in the L1 register 35a is then loaded into the L2 register 35b by the next ensuing B clock pulse. The microword residing in the L2 control register 35b drives an A decoder 37 which in response thereto produces the various control point signals for a particular microword cycle, namely, the microword cycle defined by the next ensuing A clock pulse.

A second level of multiplexing for the "B clock" PLA's 25,27 and 29 is provided by PLA output buffers 40,41 and 42. These buffers 40,41 and 42 are separate output buffers for the different PLA's 25,27, 29, respectively. These buffers 40,41 and 42 are controlled by way of separate strobe signal lines S2,SB and SD, respectively. These strobe signal lines S2,SB and SD are activated one at a time in a sequential manner by means of separate strobe signal pulses so as to pass one microword at a time to a control register mechanism 43. Control register mechanism 43 is comprised of two registers connected one after the other in cascade. The first register is a Level 1 or L1 register 43a and the second register is a Level 2 or L2 register 43b. Microwords are supplied one at a time from the PLA's 25,27 and 29 to the input of the L1 register 43a by way of a PLA output bus 44. The microword appearing on the PLA bus 44 is loaded into the L1 control register 43a by a B clock pulse. This microword is then loaded into the L2 register 43b by the next ensuing A clock pulse. The microword residing in the L2 control register 43b drives a B decoder 45 which in response thereto produces the various control point signals for a particular microword cycle, namely, the microword cycle defined by the next ensuing B clock pulse, which clock pulse is effective to enable the B gates 31 to pass the control point signals to various control lines 46 which run to the data flow unit 11, the main storage unit 12 and the I/O unit 13, different ones of these control lines being included in the control buses 16,17 and 18 of FIG. 1.

The loading of the L1 and L2 registers 35a, 35b, 43a and 43b and the enabling of the A gates 30 and B gates 31 occur during the positive-going pulse portions of the A and B clock waveforms shown in FIG. 2. Thus, the term "A clock pulse" means one of the positive-going pulse portions of the A clock waveform, and the term "B clock pulse" means one of the positive-going pulse portions of the B clock waveform.

The timing diagram portion of FIG. 4.1 shows the multiplexing or interleaving of the various microwords from the various PLA's 24–29 for the case of an assumed processor instruction "N" which requires 10 control cycles or microword cycles for its execution. The top line in FIG. 4.1 identifies the individual microword cycles in a numerical manner. The second line of FIG. 4.1 shows which of the A and B clock pulses are occurring for the different microword cycles. For simplicity of illustration, the small time gaps between the A and B clock pulses are omitted and the A and B clock intervals are shown as abutting one another. For sake of example, each microword cycle is assumed to have a duration of 50 nanoseconds. The small gap (not shown) between successive A and B clock intervals is on the order of 2 or 3 nanoseconds.

The third line of FIG. 4.1 identifies the source of the particular microword which produces the control point signals which are active to control the actions of the data processor 10 for that microword cycle. Thus, the control point signals which are in control of the data processor 10 during the first microword cycle for instruction N are produced by a 1P microword which was obtained from the first cycle PLA 24. Similarly, the control point signals which are active during the second microword cycle of instruction N are produced by a 2P microword obtained from the second cycle PLA 25. The remainder of the microwords for instruction N are obtained from the A,B,C and D decode PLA's 26–29 in a sequential A-B-C-D manner. Two such A-B-C-D sequences are required to complete the instruction N.

For sake of example, each microword is assumed to have a width of 60 bits. Thus, each of PLA's 26–29 has a set of 60 output lines, each of buffers 33,34,41 and 42 is a 60-stage buffer, each of PLA buses 36 and 44 is comprised of 60 bus lines and each of control registers 35a,35b,43a and 43b is a 60-stage register. First and second cycle PLA's 24 and 25 may have a lesser number of output lines because they are not required to provide the complete range of control actions as are required of the A,B,C and D decode PLA's 26–29. Buffers 32 and 40 have the same number of stages as there are output lines for their respective ones of the first and second cycle PLA's 24 and 25.

The overall set of 60 bits in each microword is subdivided into various control fields which may range in size from two bits up to as many as 16 bits. One of these control fields is a data flow source field, another is a data flow destination field, another is a control field for controlling the operation to be performed by the ALU in the data flow unit 11, another provides control commands for the I/O unit 15, and so forth. The data flow source and destination control fields identify the particular registers in the data flow unit 11 which are to serve as the data source and the data destination for a particular microword cycle. Some of the control fields in the 60-bit microword are encoded control fields and others are bit-significant control fields. The encoded control fields are decoded by the A and B decoders 37 and 45. The bit lines for the bit-significant fields, on the other hand, are passed straight through without modification by the decoders 37 and 45 to the A and B gates 30 and 31, respectively.

In a typical data processor, each of the decoders 37 and 45 may have a total of approximately 130 output lines, each providing a separate and distinct control point signal. In this case, each of A gates 30 and B gates 31 is comprised of 130 stages, there being a separate stage for each of the different output lines from its decoder. Each gate stage is, for example, a so-called pass transistor having its drain and source terminals connected to its input and output lines, respectively. The gate terminals of all 130 pass transistors in the set of A gates 30 are connected to the A clock line so that all 130 are simultaneously enabled during each A clock pulse interval. The B gates 31 are of a similar construction with the gate terminals of the 130 pass transistors therein being connected to the B clock line.

As further indicated in FIG. 3, a goodly number of the control point lines 46 which run to the other units in the data processor 10 are capable of receiving control point signals from either one of the A gates 30 and the B gates 31. Thus, for example, a control point line 47 from A gates 30 is connected to a control point line 48 from the B gates 31 to provide a joint control point line 49 which runs to an appropriate control point in one of the units 11,12 and 13 shown in FIG. 1. In this manner, the majority of control points in units 11,12 and 13 can be activated during either the A clock active interval or the B clock active interval, depending upon the wishes of the microcoder who designs the microword routines. Another example of this is the control point line 22 which controls the loading of the instruction register 20 in the data flow unit 11. As indicated in FIG. 3, this control point line 22 is connected to both a control point line 50 from the A gates 30 and a control point line 51 from the B gates 31. Thus, the instruction register 20 can be loaded during either the A clock pulse interval or the B clock pulse interval.

For present purposes, it is important to note that each microword includes a plural-bit PLA output strobe field. This is a bit-significant control field which is used to generate the various PLA output strobe signals S1,S2,SA,SB, SC and SD for the various PLA output buffers 32–34 and 40–42. These strobe signals select the next PLA which is to be gated into its respective control register mechanism. Because the microwords from the "A clock" PLA's 24,26 and 28 and the microwords from the "B clock" PLA's 25,27 and 29 are handled by separate and different control register and decoder mechanisms, the same bit position in the microword PLA strobe field can be used to provide both an "A clock" PLA strobe and a "B clock" PLA strobe. In particular, a first bit position in the PLA strobe field in each microword generated by the "A clock" PLA's 24,26 and 28 is used to provide the S1 strobe signal appearing at the output of A gates 30. In a corresponding manner, the first bit position in each PLA strobe field in each of the microwords from "B clock" PLA's 25,27 and 29 is used to produce the S2 strobe signal appearing at the output of B gates 31. In a similar manner, a second bit position in the strobe field of the "A clock" microword is used to produce the strobe signal SA and a second bit position in the strobe field of the "B clock" microword is used to produce the strobe signal SB. Likewise, a third bit position in the "A clock" and "B clock" strobe fields is used to produce the strobe signals SC and SD, respectively.

Three separate strobe signal control point lines S1,SA and SC run from three separate outputs of the A gates 30 to the control terminals of the respective ones of the PLA output buffers 32,33 and 34. For simplicity of illustration, these three control point lines are represented as being included in a pluralline bus 52. In a corresponding manner, three separate strobe signal control point lines S2,SB and SD run from three separate outputs of the B gates 31 to the control terminals of the respective ones of the PLA output buffers 40,41 and 42. For simplicity of illustration, these three control point lines are represented as being included in a plural-line bus 53.

FIG. 4.1 shows the relative timing relationships for the PLA output strobe pulses applied to the strobe signal control point lines S1,S2,SA,SB,SC and SD. An S1 strobe pulse is produced by a CP microword obtained from the C decode PLA 28. This CP microword becomes active to produce the control point signals during microword cycle 17 of the previous instruction N−1. This S1 strobe pulse enables the buffer 32 to supply the microword appearing at the output of the first cycle PLA 24 to the L1 control register 35a. This microword is loaded into the L1 control register 35a by the A clock pulse which occurs during this same microword cycle 17. The B clock pulse occurring during the next microword cycle, namely, cycle 18, loads this microword into the L2 control register 35b. This microword then commences to drive the A decoder 37. The next ensuing A clock pulse, which occurs during microword cycle 1 of instruction N, enables the A gates 30 to enable the control point signals produced by this first cycle PLA microword to become the active control point signals for controlling the data processor 10. This is indicated by the 1P designation in the "active microword" row of FIG. 4.1.

As indicated in FIG. 4.1, the PLA strobe field of this 1P microword generates an SA strobe pulse. This SA strobe pulse is applied to the buffer 33 to select the microword appearing at the output of the A decode PLA 26 for loading into the L1 register 35a. When this microword becomes active to produce the control point signals during microword cycle 3 of instruction N, it, in turn, produces an SC strobe pulse. This is supplied to the output buffer 34 to select the microword from the C decode PLA 28. In this manner, the microword from any given one of the "A clock" PLA's 24,26 and 28 selects the next "A clock" PLA to be gated into the A control register mechanism 35. Thus, the multiplexing of the microwords from the "A clock" PLA's is controlled by the microwords themselves.

A corresponding type of microword multiplexing is also occurring for the microwords from the "B clock" PLA's 25,27 and 29, the "B clock" multiplexing actions being interleaved with the multiplexing actions for the "A clock" PLA's 24,26 and 28. In particular, the S2,SB and SD strobe pulses for the "B clock" PLA's are produced during the B clock intervals, as opposed to the producing of the "A clock" strobe pulses S1,SA and SC during the A clock intervals. Each "B clock" microword selects the next "B clock" PLA to be gated into the B control register mechanism 43.

At this point, it is helpful to look at the mechanisms which supply the input signals to the various PLA's 24–29 and to consider how each of the PLA's 24–29 is caused to produce different microwords at its output. For explanation purposes, this process starts with the loading of a new processor instruction into the instruction register 20 in the data flow unit 11. This can occur any time after the occurrence of an Sφ restart control pulse for the previous processor instruction and up until as late as two microword cycles before the occurrence of the Sφ restart control pulse for the new processor instruction. The Sφ restart control pulses appear on a control point line 54 which emanates from the B decoder 45 by way of the B gates 31. As indicated in FIG. 4.1, this restart control pulse Sφ is produced by the microword which is active during the second from the last microword cycle of the preceding processor instruction. The restart control pulse Sφ for processor instruction N is produced during microword cycle 16 of the preceding instruction N−1. The restart control pulse Sφ for the next processor instruction N+1 occurs during microword cycle 8 of processor instruction N.

Each of PLA's 24–29 is a dynamic or clocked PLA. The internal clock timings for these PLA's is indicated in FIG. 4.3. As there indicated, each of these PLA's 24–29 is driven by a so-called four-phase clock, the four phases being C1, C2, C3 and C4. These internal timings for the PLA's must be taken into account in determining the appropriate times for changing the inputs to the PLA's.

For sake of example, the processor instruction word loaded into the instruction register 20 is assumed to be a 16-bit word. For the case of plural-word processor instructions, it is the first word of such instructions which is loaded into the instruction register 20. All 16 bits of the instruction word in instruction register 20 are supplied by way of a bus 21 to an encode PLA 55 in the control unit 14. A lesser number of bits, corresponding to the effective operation code portion of the instruction word in register 20 are supplied by way of buses 21 and 56 to the inputs of the first and second cycle PLA's 24 and 25. By PLA input is meant the input lines to the AND array portion of the PLA.

The first cycle PLA 24 is responsive to the effective operation code bits appearing on the bus 56 during the internal C2 clock interval for such PLA 24. For the case of instruction N shown in FIG. 4, this C2 interval occurs during microword cycle 15 of the preceding instruction N−1. The internal timing for the first cycle PLA 24 is indicated by the internal timing line 1P in FIG. 4.3. The desired operation code bits must be present and in a stable condition on the input bus 56 at this C2 time for the 1P or first cycle PLA 24. In response to the operation code bits on input bus 56, the first cycle PLA 24 outputs a particular one of the many microwords which are prefabricated therein. This output microword is constructed or coded to provide the proper control actions for the first microword cycle for instruction N. Since the various different processor instructions in the overall processor instruction set can be classified into groups wherein exactly the same first cycle control actions are needed for each member of the group, the number of microwords in the first cycle PLA 24 is less than the total number of different processor instructions in the overall processor instruction set.

The selected microword becomes valid at the output of the first cycle PLA 24 during the C4 internal timing interval for the PLA 24. During this same time interval, the S1 strobe pulse is supplied to the buffer 32 to enable this selected first cycle microword to be loaded into the L1 control register 35a. As previously indicated, this first cycle microword becomes effective to control the data processor 10 during the first microword cycle for instruction N, this being the time when its control point signals are being passed by the A gates 30.

The second cycle PLA 25 responds to the operation code bits on the input bus 56 in a corresponding manner to select the appropriate microword for the second microword cycle for the processor instruction resident in the instruction register 20. The internal timing for this second cycle PLA 25 is indicated by the 2P internal timing line of FIG. 4.3. PLA 25 takes in the effective operation code bits during its C2 interval and it provides at its output during its C4 interval the particular microword selected by these operation code bits. The S2 strobe pulse, which occurs during this C4 interval, enables the buffer 40 to enable the selected second cycle microword to be transferred to the B control register 43a. Like for the first cycle PLA 24, the second cycle PLA 25 may include a lesser number of microwords than there are instructions in the overall processor instruction set.

The first and second cycle PLA's 24 and 25 only provide the two microwords for the first two microword cycles needed for the execution of each processor instruction. The remainder of the microwords for each processor instruction are provided by the A, B, C and D decode PLA's 26–29.

The A, B, C and D decode PLA's 26–29 receive their input driving signals from the encode PLA 55 and from a sequence counter 57. Sequence counter 57 is a plural-stage binary counter. For simplicity of explanation herein, the encode PLA 55 is assumed to be a so-called "static" PLA. As such, it does not require the internal clocking signals. The purpose of the encode PLA 55 is to produce at its output an instruction identification (ID) number having a lesser number of bits than the number of bits in the processor instruction supplied to the input of the encode PLA 55. In a representative embodiment of the invention, the processor instruction word supplied to the input of encode PLA 55 includes 16 bits, whereas the instruction ID number appearing at the output of encode PLA 55 contains 11 bits. The purpose of this reduction in the number of bits is to reduce the number of AND array input lines required in each of the decode PLA's 26–29 and hence to reduce the size of such PLA's. Each instruction ID number produced at the output of encode PLA 55 is uniquely representative of the particular processor instruction which produced it. Thus, it uniquely identifies to the decode PLA's 26–29 the particular processor instruction to be executed. From a size standpoint, the encode PLA 55 is relatively small compared to the sizes of any of the decode PLA's 26–29. Also, depending upon the coding of their processor instruction sets, the use of the encode PLA 55 may not be needed for some types of data processors.

The instruction identification (ID) number appearing at the output of the encode PLA 55 is loaded into a buffer register 58 by the Sφ restart control pulse. The ID number in register 58 remains constant for the duration of the generation of the various A, B, C and D microwords by the decode PLA's 26–29. The sequence counter 57 is reset to zero by the same Sφ restart control pulse which loads the instruction ID register 58. In general, the sequence counter 57 is incremented at periodic intervals during the execution of any given processor instruction to enable each of the decode PLA's 26–29 to produce a sequence of microwords. In an approximate sense, the instruction ID number in register 58 provides a base address or starting address for a group of microwords in a given decode PLA and the sequence counter 57 provides a series of displacement addresses for accessing the individual microwords in the selected group.

Since the decode PLA's 26-29 produce an A-B-C-D sequence of microwords, the sequence counter 57 is incremented by a count of one for each such A-B-C-D sequence. In the present embodiment, this is accomplished by the PLA strobe pulse SB which emanates from the B gates 31 once for each such A-B-C-D sequence.

As indicated in FIG. 3, the instruction ID number in register 58 is supplied in parallel to a first set of input for each of the A,B,C and D decode PLA's 26-29. The in-sequence number value in sequence counter 57 is supplied directly to a second set of inputs of each of the A and B decode PLA's 26 and 27. A delayed replica of this sequence count number is supplied by way of a buffer register 59 to the second set of inputs for each of the C and D decode PLA's 28 and 29. This plural-stage buffer register 59 is reset to an all zero condition by the same S$\phi$ reset control pulse that resets the sequence counter 57 to zero. The count value or number value in sequence counter 57 is loaded into register 59 at periodic intervals by the PLA strobe pulses SC. As seen from FIG. 4, this SC strobe pulse occurs one microword cycle later than the SB strobe pulse which increments the sequence counter 57. As a consequence, the loading of the new sequence count number is delayed by one microword cycle relative to the appearance of this new number in the sequence counter 57. Among other things, this one cycle delay enables the C and D decode PLA's 28 and 29 to properly respond to the old sequence count number before it is changed.

Looking at the PLA internal timing pattern AP of FIG. 4.3, it is seen that the SB strobe pulse (FIG. 4.1) which increments the sequence counter 57 during microword cycle 2 of instruction N occurs during the C1 interval for the A decode PLA 26. This is one cycle before the C2 interval during which the A decode PLA 26 takes in the count value from the sequence counter 57. With reference to the PLA internal timing pattern DP for the D decode PLA 29, it is seen that the SC strobe signal (cycle 3 of instruction N) which loads the new number into the count buffer register 59 occurs during the C3 interval for the D decode PLA 29. This is one cycle after the C2 interval during which the D decode PLA 29 takes in the count value from register 59. Thus, the D decode PLA 29 is allowed to take in the first sequence count value before the second sequence count value is loaded into the register 59.

The control unit 14 of FIG. 3 also includes a PLA clock logic mechanism 60 which is responsive to the restart pulse S$\phi$, the various PLA output strobe pulses S1,S2,SA,SB,SC and SD and the A and B clock pulses for producing PLA clock signals PC1 through PC9 which are used to produce the internal C1-C2-C3-C4 timing pulses for the different ones of the PLA's 24-29. The output bus 61 for the PLA clock logic 60 includes a separate bus line for each of the different PLA clock signals PC1-PC9. Thus, there are nine such bus lines in the output bus 61. Four of these bus lines are connected to the four timing pulse inputs of each of the PLA's 24-29, a different set of four bus lines being used for each of the different PLA's 24-29. The chart of FIG. 5 shows the particular PLA clock bus lines which are connected to the different ones of the PLA's 24-29. Thus, for example, the PC1,PC2,PC3 and PC4 clock bus lines are connected to the first cycle PLA 24 to respectively provide therein the C1,C2,C3 and C4 internal timing pulses. As further indicated by FIG. 5, clock bus lines PC2-PC5 are connected to the second cycle PLA 25, clock bus lines PC3-PC6 are connected to the A decode PLA 26, and so forth.

The relationships between the PLA clock pulses PC1-PC9 and the PLA internal timing intervals C1,C2,C3 and C4 are shown in FIGS. 4.2 and 4.3. Considering, for example, the first cycle PLA 24, the PC2 clock pulses are used to provide therein the C2 internal timing pulses. Comparing the PC2 waveform with the 1P timing pattern for the first cycle PLA 24, it is seen that the PC2 pulses occurring during cycle 15 of instruction N−1 and cycle 7 of instruction N do indeed correspond to the C2 intervals for the 1P PLA 24. Further inspection of the PC2 waveforms, however, further reveals that additional C2 timing pulses are produced during cycles 1, 3 and 5 of instruction N. These C2 pulses are of no consequence and hence are not shown in FIG. 4.3. As will be seen, the effect of these undesired C2 pulses is immediately removed by the C1 pulses produced during microword cycles 2, 4 and 6 by the PC1 clock pulses.

Other unneeded internal clock pulses are produced in various ones of the PLA's 24-29 by the PLA clock signals PC1-PC5. The timings of these unneeded internal clock signals are, however, such that they do not affect the validity of the output signals appearing at the outputs of the various PLA's at the moments such outputs are transferred to their respective control register mechanisms. For this reason, none of these unneeded internal timing pulses are shown in FIG. 4.3.

The PLA clock signals PC1-PC9 are derived from the S$\phi$ restart pulses, the S1,S2,SA,SB,SC and SD strobe pulses and the A and B clock pulses by means of combinatorial logic circuitry located within the PLA clock logic mechanism 60. The nature of this combinatorial logic circuitry can be discerned by comparing the individual PC1-PC9 waveforms of FIG. 4.2 with the S$\phi$-SD waveforms of FIG. 4.1. In particular, the PC1 clock waveform is the same as the B clock waveform except that the B clock pulses occurring during the occurrence of the S$\phi$ restart pulses and the S2 strobe pulses are deleted. The PC2 waveform is the same as the A clock waveform except that the A clock pulses occurring during the occurrence of the S1 strobe pulses are deleted. The PC3 clock waveform is obtained by OR'ing the S$\phi$ restart pulses and the SB strobe pulses. The PC4 clock waveform is obtained by OR'ing the S1 and SC strobe pulses. The PC5 clock waveform is obtained by OR'ing the S2 and SD strobe pulses. The PC6,PC7,PC8 and PC9 clock waveforms are the same as the SA,SB,SC and SD strobe pulse waveforms, respectively.

DESCRIPTION OF DYNAMIC PLA INTERNAL CONSTRUCTION OF FIG. 6.

Referring to FIGS. 6.1 and 6.2 (collectively referred to as FIG. 6), there is shown the form of internal construction used for each of the dynamic PLA's 24-29 of FIG. 3. FIG. 6 does not show the complete internal construction of a dynamic PLA. In particular, only some of the numerous AND array input lines, product lines and OR array output lines are shown. Enough is shown, however, to gain a clear understanding of the internal nature and the manner of operation of the dynamic PLA.

As shown in FIG. 6, a dynamic programmable logic array includes an input AND array 62 coupled to an output OR array 63 by means of various product lines 64-67. These product lines 64-67 extend completely across both the AND array 62 and the OR array 63. Typical AND array input lines are indicated at 68-73. These input lines extend completely across the AND array 62 at right angles to the product lines 64-67. Typical OR array output lines are indicated at 74-77. They extend completely across the OR array 63 at right angles to the product lines 64-67.

The PLA shown in FIG. 6 is formed on or fabricated on a large scale integration (LSI) integrated circuit chip. All of the transistors shown in FIG. 6 are metal oxide semiconductor (MOS) type field effect transistors (FET's). More particularly, each of the transistors shown in FIG. 6 is an enhancement mode type of MOS-FET transistor.

The PLA of FIG. 6 also includes precharge circuitry which is responsive to the C1 internal clocking pulse to precharge each of the AND array input lines 68-73 to a predetermined positive voltage level. This precharge circuitry includes transistors 80-85 which are individually connected in series between a positive voltage source +V and different ones of the AND array input lines 68-73. The predetermined voltage level to which each AND array input line is charged is approximately equal to +V less the amount of the voltage drop across one of the transistors 80-85 when conductive. These precharge transistors 80-85 are turned on or rendered conductive by the positive-going C1 clock pulse which is simultaneously applied to each of their gate terminals.

The dynamic PLA of FIG. 6 further includes bit partitioning circuitry 86 and validation circuitry 87 for coupling a plurality of binary signal input lines 88 to the AND array input lines 68-73. The bit partitioner 86 includes a plurality of inverter circuits 89, 90 and 91 individually coupled to different ones of the binary signal input lines 88 for providing a binary output signal which is the complement of the binary signal appearing on its input line. Thus, each of input lines 88 is partitioned into two bit lines one bearing the true value of the input signal and the other bearing the complement value of the input signal. Thus, for example, the Bit 1 input line is partitioned into two bit lines 92 and 93, line 92 providing the true value of the Bit 1 input signal and line 93 providing the complement value of the Bit 1 input signal. This form of bit partitioning is called "single bit" partitioning.

Each output line from the bit partitioner 86 is coupled to a different one of the AND array input lines 68-73 by way of its own individual validation circuitry. The validation circuitry for the bit partitioner output line 92 is represented by series-connected transistors 94 and 95, the drain terminal of the transistor 95 being connected to the AND array input line 68 and the source terminal of the transistor 94 being connected to circuit ground. The validation circuitry for the bit partitioner output line 93 is represented by series-connected transistors 96 and 97, the drain terminal of transistor 97 being connected to the AND array input line 69 and the source terminal of the transistor 96 being connected to circuit ground. The validation circuits for the remainder of the bit partitioner output lines are constructed in a corresponding manner.

The validation circuitry 87 is activated by the positive-going C2 internal timing pulse for the PLA. This C2 timing pulse is simultaneously applied to the gate terminals of the lowermost transistors in each of the series-connected pairs. This causes a discharging to circuit ground of those AND array input lines 68-73 for which the binary value on the gate terminal of the upper transistor in its series-connected pair is at a binary one value. Thus, during the C2 timing pulse, the AND array input line 68 is discharged if the gate terminal of the transistor 94 is at a high voltage level. In this case, both of transistors 94 and 95 would be conductive during the C2 interval to provide a discharge path to circuit ground for the AND array input line 68. Conversely, if the signal at the gate terminal of transistor 94 is at a low level, then transistor 94 remains nonconductive during the C2 interval and the AND array input line 68 remains at its precharged high level.

In terms of high and low signal levels, this validation mechanism provides a signal inverting action. Thus, the signal level on AND array input line 68 is the inverted or complemented value of the signal level on the bit partitioner output line 92. In this manner, the signal levels on AND array input lines 69, 71 and 73 correspond to the true values of the Bit 1, Bit 2 and Bit 3 signal levels, respectively. The signal levels on AND array input lines 68, 70 and 72, on the other hand, correspond to the complement values of the Bit 1, Bit 2 and Bit 3 input signal levels, respectively.

The logical relationships between the AND array input lines 68-73 and the product lines 64-67 are determined by the personalization pattern for the AND array 62. This personalization pattern is determined by the locations and gate connections of various transistors which enable connections of the product lines 64-67 to circuit ground. Typical AND array personalizing transistors are represented by transistors 100-108. The locations and gate connections of these transistors 100-108 determine the logical function provided by the AND array 62. The particular personalizing pattern shown in FIG. 6 is not intended to have any significance in terms of the microwords required to be produced in any given PLA in the control unit 14. It is merely an arbitrary pattern that was selected for purposes of explaining the operation of the PLA.

A precharging and validating (selective discharging) sequence is also provided for the product lines 64-67. The precharge circuitry for the product lines 64-67 includes transistors 110-113 which individually connect the different ones of the product lines 64-67, respectively, to a positive voltage source +V. These precharging transistors 110-113 are simultaneously enabled by the C2 internal timing pulse to precharge each of the product lines 64-67 to a voltage level of approximately +V less the voltage drop across one of the transistors 110-113 when conductive.

The validation circuitry for the product lines 64-67 includes transistors 114 and 115 which, when conductive, serve to connect the source terminals of the various personalizing transistors 100-108 to circuit ground. These product lines validating transistors 114 and 115 are rendered conductive by the positive-going C3 internal timing pulse. Thus, the product lines 64-67 are validated during the C3 timing interval.

Considering, for example, the validation of the product line 64, if the gate terminal of any of the transistors 100, 101 and 102 is at a high level (the precharged level) during the C3 validation interval, then the product line 64 is discharged to a low level by way of the conductive one or ones of such transistors and the validating transistor 114. A high level at the gate terminal of an enhancement mode FET transistor renders it conductive. If, on the other hand, the gate terminal of each of these transistors 100, 101 and 102 is at a low level during the C3 validating interval, then each of these transistors remains nonconductive and the product line 64 is not discharged.

The validated signal on a product line represents the NOR combination of all the input signals that are connected to the gate terminals of the AND array transistors which are attached to it. In the example shown, the validated signal value on product line 64 represents the logical relationship $\overline{1+2+3}$, where 1, 2 and 3 represent the Bit 1, Bit 2 and Bit 3 input signals, respectively, and the plus symbol represents the OR function. This is equivalent to the logical relationship "$\overline{1}.\overline{2}.\overline{3}$", where the dot symbol represents the AND function. Thus, the validated signal level on product line 64 will be a high level if Bits 1, 2 and 3 have a code pattern of "111". If any of Bits 1, 2 and 3 has a zero value, then the validated level on product lines 64 will be a zero (low) level.

The logical relationship for product line 65 is $\overline{1}.\overline{2}$, the logical relationship for product line 66 is $1$ and the logical relationship for product line 67 is $1.\overline{2}.\overline{3}$. Thus, the validated level for product line 65 will be a high level if the input bit pattern is "10X". Otherwise, it will be a low level. The "X" represents a "don't care" condition. By "don't care" is meant that the result is not affected by the value of this particular bit. In this particular example for product line 65, it means that input bit 3 does not enter into the determination of the validated signal value on product line 65.

A validated high level is produced on the product line 66 if the input bit pattern is "0XX". A validated high level is produced on the product line 67 if the input bit pattern is "011". If neither of these input bit patterns is present, then each of product lines 66 and 67 will be discharged to a low level during the C3 validation interval.

The important thing to note regarding the AND array 62 is that the coding of the input bit pattern on input bit lines 88 determines which, if any, of the product lines 64–67 is to be validated to an active condition. Assuming for sake of example that the active condition on a product line is the high level condition, then the input bit code determines which, if any, of the product lines 64–67 is allowed to remain at a high level during and immediately following the C3 validation interval. The validated signal levels which are established on the product lines 64–67 during the C3 interval remain valid until the next precharging of the product lines 64–67, which precharging occurs during the occurrence of the next following C2 timing pulse.

The OR array 63 is responsive to the validated signal values on the product lines 64–67 to produce microword bit patterns on the OR array output lines 74–77. This is accomplished by the proper personalization of the OR array 63. Such personalization is determined by the locations and gate connections of various transistors which enable the OR array output lines 74–77 to be connected to circuit ground. Typical OR array personalizing transistors are represented by transistors 116–121. The particular personalization pattern shown in FIG. 6 is for explanatory purposes only and is not intended to have any significance in terms of the actual microwords generated by any of the PLA's 24–29 in the control unit 14.

A precharging and validating (selective discharging) sequence is also used for the OR array output lines. The precharge circuitry for the OR array output lines 74–77 includes transistors 122–125, the source terminals of which are connected to different ones of the OR array output lines 74–77, respectively, and the drain terminals of which are connected to a positive voltage source +V. The gate terminals of these precharging transistors 122–125 are simultaneously activated by the C3 internal timing pulse to simultaneously precharge each of the OR array output lines 74–77. Each of the OR array output lines 74–77 is precharged to a voltage level of approximately +V less the voltage drop across one of the precharging transistors 122–125 when conductive.

The validation circuitry for the OR array output lines 74–77 includes transistors 126 and 127. These validating transistors 126 and 127 are simultaneously rendered conductive by the simultaneous appearance of a positive-going C4 timing pulse at their gate terminals. When conductive, these transistors 126 and 127 provide a discharge path to circuit ground for the various OR array personalizing transistors 116–121. Thus, for the OR array output line 74, for example, if either of the personalizing transistors 116 and 120 is conductive during the C4 timing interval, the OR array output line 74 will be discharged via the conductive personalizing transistor and the validating transistor 126 to circuit ground. If neither of the personalizing transistors 116 and 120 is conductive, then the OR array output line 74 will remain at its high precharged level during and immediately following the C4 timing interval.

The output signal on each of the OR array output lines 74–77 represents the NOR combination of the input signals that are supplied to the gate terminals of the OR array transistors which are attached to it. Thus, for example, the output signal on the OR array output line 74 represents the NOR combination of the input signals supplied to the gates of transistors 116 and 120. These input signals are, of course, the signals appearing on product lines 64 and 66, respectively. The validated signal values established on the OR array output lines 74–77 during the C4 validation interval remain on the output lines 74–77 until the occurrence of the next occurring C3 timing pulse, at which time the OR array output lines 74–77 are again precharged.

The OR array output lines 74–77 are coupled by way of individual output buffer stages 130–133, respectively, to their respective bus lines in a plural-conductor signal transfer bus labeled in FIG. 6 as "PLA output bus". Thus, OR array output line 74 is coupled by way of the buffer stage 130 to the Bit 1 line of the PLA output bus, OR array output line 75 is coupled by way of buffer stage 131 to the Bit 2 line of the PLA output bus, and so forth. Each of the output buffer stages 130–133 is of the same internal construction. These output buffer stages 130–133 are enabled in unison by a PLA output strobe pulse supplied to each of the buffer stages 130–133 by way of a strobe line 134. When enabled, the buffer stages 130–133 produce on the PLA output bus a signal pattern corresponding to the signal pattern appearing on the OR array output lines 74–77. The internal construction and operation of a representative buffer stage will be discussed in detail hereinafter.

The timing relationships for the C1,C2,C3 and C4 internal timing pulses for the programmable logic array of FIG. 6 are shown in FIG. 7. These are non-overlapping pulses, there being a small time gap between the trailing edge of the C1 pulse and the leading edge of the C2 pulse, between the trailing edge of the C2 pulse and the leading edge of the C3 pulse and between the trailing edge of the C3 pulse and the leading edge of the C4 pulse. The duration of each of these C1–C4 pulses is the same as the duration of each of the positive-going A clock and B clock pulses, this duration being approximately 50 nanoseconds. The C1,C2,C3 and C4 pulse sequence shown in FIG. 7 is repeated over and over again for any given PLA in the manner indicated in the lower FIG. 4.3 portion of the timing diagram of FIG. 4. As indicated in FIG. 4, the C1-C4 sequences for the different PLA's 1P-DP are offset in time relative to one another.

The table of FIG. 8 shows the internal PLA functions provided by each of the internal timing or clocking pulses C1,C2,C3 and C4. As there indicated, overlapping precharge and validate sequences are provided for the AND array input lines, the product lines and the OR array output lines. These precharge and validate sequences move the "data" through the dynamic PLA. A major advantage of a dynamic PLA, as compared to a static PLA, is that it dissipates considerably less power than does an equivalent static PLA.

Each of the dynamic PLA's 24-29 shown in FIG. 3 for the control unit 14 is of the same general internal construction as indicated in FIG. 6. As previously indicated, each of the actual PLA's 24-29 of FIG. 3 will have a substantially greater number of AND array input lines, a substantially greater number of product lines and a substantially greater number of OR array output lines than is shown for the PLA of FIG. 6. Nevertheless, the manner of operation using the overlapping precharge and validate sequences indicated in FIG. 8 remain the same.

A straightforward way of constructing a programmable logic array like that shown in FIG. 6 for use in the control unit 14 shown in FIG. 3 is to position and connect the personalizing transistors in the AND array so that each unique input bit code to the PLA will render active a different one of the product lines. The personalizing transistors in the output OR array are then located and connected so that when any given product line is activated, the proper microword bit pattern is produced on the OR array output lines. When this approach is used, the presence and absence of the OR array transistors along the individual product lines can be thought of as providing the bit patterns for the different microwords and the rendering active of a particular product line by the AND array can be thought of as the selecting of a particular one of the OR array defined microwords for outputting on the OR array output lines. Thus, each input bit code to the AND array selects a particular product line and the selected product line causes a particular microword to be supplied to the output of the OR array.

In some embodiments, more sophisticated AND array and OR array personalization patterns can be used to reduce the required number of product lines and hence to reduce the overall size of the PLA.

Figure 9:
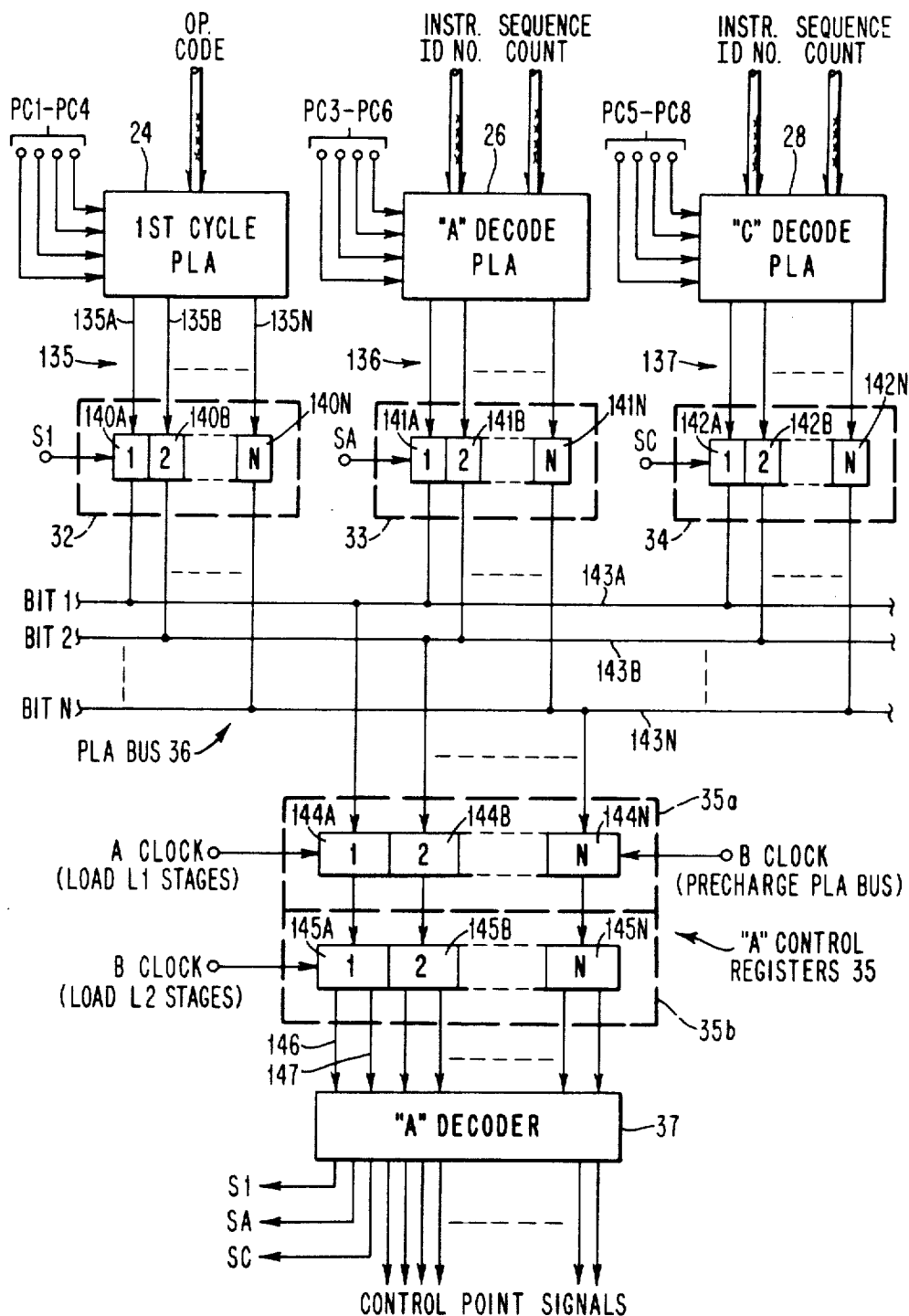
FIG. 9 shows in greater detail the construction of the PLA output buffers, the PLA output bus and the control registers for a portion of the control unit of FIG. 3.

Description of PLA Output Bus Mechanism of FIG. 9

FIG. 9 shows in greater detail the construction of the PLA output bus 36 and the output buffers 32,33 and 34 and the A control register mechanism 35 which are connected thereto. All of the elements shown in FIG. 9 are formed on the same integrated circuit chip. The mechanism shown in FIG. 9 comprises an integrated circuit mechanism for coupling the separate sets of OR array output lines 135,136 and 137 from a plurality of dynamic programmable logic arrays 24,26 and 28 to the same set of bus lines (Bits 1-N) of a plural-line signal transfer bus 36. The bus lines of the PLA bus 36 are, in turn, individually coupled to the input lines for different stages of a plural-stage receiving register 35a.

Each of the PLA output buffers 32,33 and 34 includes a plurality of output buffer stages. Thus, the output buffer 32 includes a plurality of buffer stages 140a-140n, the output buffer 33 includes a plurality of buffer stages 141a-141n and the output buffer 34 includes a plurality of buffer stages 142a-142n. The bus lines in the PLA bus 36 are identified by reference numerals 143a-143n. The plural-stage receiving register 35a includes a plurality of register stages 144a-144n. The "a" buffer stages 140a,141a and 142a of the various PLA output buffers 32,33 and 34 are connected to one and the same PLA bus line, namely, the "a" bus line 143a. This "a" bus line 143a is, in turn, coupled to the "a" stage 144a of the receiving register 35a. Similar considerations apply to the "b"---"n" buffer stages, the "b"---"n" bus lines and the "b"---"n" receiving register stages.

The L1 register 35a also includes precharge circuitry for precharging each of the PLA bus lines 143a-143n during a first time interval. More particularly, each of the individual register stages 144a-144n includes precharge circuitry for precharging the corresponding one of the PLA bus lines 143a-143n, respectively. These individual precharge circuits are simultaneously activated during the first or precharging time interval by the B clock pulse which is supplied to the L1 register 35a. As will be seen, the PLA bus lines 143a-143n are precharged during a time interval prior to the validation interval for the OR array output lines of any of the PLA's 24,26 and 28.

The output buffer stages for any given PLA are responsive to the strobe signal for such PLA for discharging during a second time interval those PLA bus lines for which the PLA OR array output lines are at a particular binary value. Thus, for example, the output buffer stages 140a-140n for the first cycle PLA 24 are responsive to the strobe signal S1 for such PLA 24 for discharging during the second time interval those bus lines of the PLA bus 36 for which the PLA OR array output lines 135a-135n are at a particular binary value. This selective discharging of the PLA bus lines 143a-143n occurs during an A clock pulse interval. This selective discharging produces on the PLA output bus 36 the same bit pattern as is being output by the first cycle PLA 24. This bit pattern on PLA bus 36 is loaded into the L1 register 35a during the same A clock pulse interval that the PLA bus lines 143a-143n are selectively discharged.

The PLA bus lines 143a-143n are thereafter again precharged by the next following B clock pulse which is supplied in parallel to the individual precharge circuits in each of the register stages 144a-144n. This prepares the PLA bus 36 to receive the microword bit pattern from the next PLA, namely, the A decode PLA 26, this being accomplished by the occurrence of the strobe signal SA during the next A clock pulse interval. In this manner, the PLA bus 36 is continually being precharged and then selectively discharged.

The outputs of the individual L1 register stages 144a-144n are connected to the inputs of the corresponding ones of the L2 register stages 145a-145n, respectively. The microword bit pattern resident in the L1 stages is transferred to or loaded into the L2 stages during a B clock pulse interval, the B clock pulses being supplied to the load control terminals of the individual L2 register stages 145a-145n in a parallel or simultaneous manner. The true and complement outputs of each of the L2 register stages 145a-145n are connected to the A decoder 37. The true and complement signal output lines for the L2 register stage 145a, for example, are indicated at 146 and 147.

Representative embodiments for the L1 and L2 register stages will be described hereinafter. For these representative embodiments, the L1 register stages are dynamic register stages and the L2 register stages are static register stages.

The number of bus lines comprising the PLA output bus 36 is equal to the number of bits in a complete microword. For sake of example, the number of bits in a complete microword was assumed to be 60. Thus, for this example, the PLA bus 36 has 60 bus lines. Likewise, each of the L1 and L2 registers 35a and 35b includes 60 individual register stages, there being a separate register stage for each of the PLA bus lines. Each of the A and C decode PLA's 26 and 28 is constructed to provide complete microwords. Thus, each of these PLA's 26 and 28 has 60 OR array output lines and each of the output buffers 33 and 34 includes 60 individual buffer stages. As previously mentioned, it is not necessary for the first cycle PLA 24 to provide complete microwords. The first cycle PLA 24 can instead supply partial microwords from which some of the control fields for the complete microword are omitted. Thus, the PLA 24 may have less than 60 OR array output lines and its output buffer 32 may have less than 60 individual buffer stages. Thus, some of the PLA bus lines will not receive any output from the buffer 32. By way of example only, the first cycle 24 may have 20 OR array output lines, in which case its output buffer 32 will have 20 individual buffer stages.

The example of a complete microword having 60 bits is only intended to give the reader a feeling for the relative size of the units which produce and handle the microwords. There is nothing critical about the number 60 and different sized microwords may be used in different data processors.

In the embodiment described herein, negative active logic is used for the PLA bus 36. In other words, a low level (the discharged level) on a PLA bus line is used to represent a logical "one" value and a high level (the precharged level) is used to represent a logical "zero" value.

The output bus mechanism for the other PLA output bus 44 of FIG. 3 is of the same construction as shown in FIG. 9, except that different PLA clock signals, different strobe signals and different A and B clock signals are supplied to the corresponding elements associated with the PLA bus 44. As previously indicated, the operations for the second PLA bus 44 and its associated buffers and registers are 180° out of phase relative to the operations for the corresponding units for the first PLA bus 36.

Figure 10:
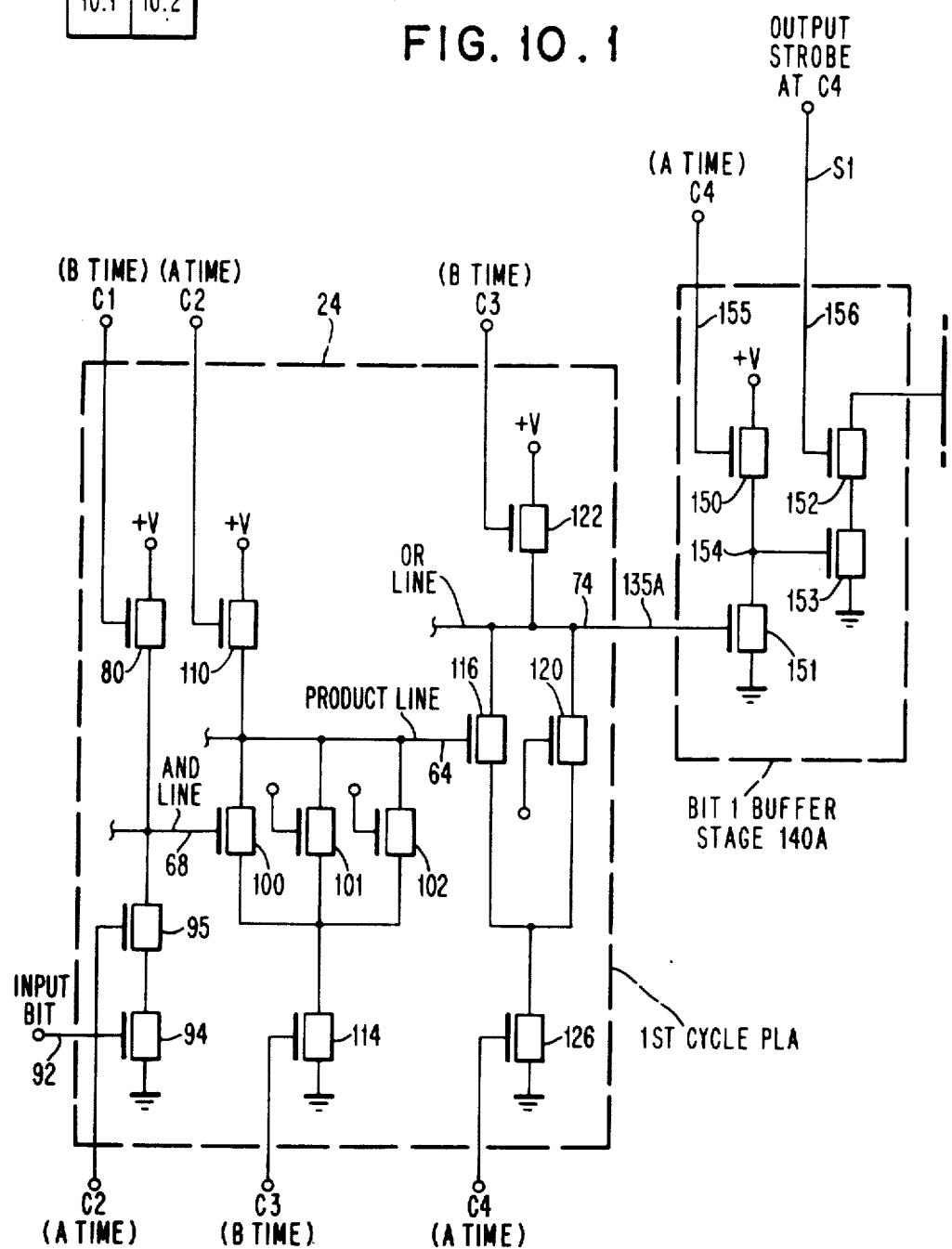
FIGS. 10.1 and 10.2, when combined in the manner shown in FIG. 10, in greater detail a representative form of construction for one of the PLA output buffer stages, one of the L1 control register stages and one of the L2 control register stages of FIG. 9.

Description of Output Buffer and Control Register Details of FIG. 10

Referring to FIGS. 10.1 and 10.2 (collectively referred to as FIG. 10), there is shown in greater detail the internal construction of one of the output buffer stages, one of the L1 register stages and one of the L2 register stages of FIG. 9. In particular, FIG. 10 shows the internal details for the Bit 1 buffer stage 140a of the PLA output buffer 32, the Bit 1 L1 register stage 144a of the L1 register 35a and the Bit 1 stage 145a of the L2 register 35b. FIG. 10 also shows in block form the Bit 1 buffer stages 141a and 142a for the other two output buffers 33 and 34, these buffer stages also being connected to the Bit 1 PLA bus line 143a. FIG. 10 further shows the details of one of the various possible "signal" paths through the first cycle PLA 24. For purposes of comparison, the circuit elements associated with this signal path through PLA 24 are given the same reference numbers as are used for the corresponding circuit elements in the PLA of FIG. 6. The purpose of showing this representative signal path for the PLA 24 is to enable a correlation between the internal PLA timing intervals with the timing intervals for the output buffer stage 140a and the L1 and L2 register stages 144a and 145a.

As shown in FIG. 10, the PLA output buffer stage 140a couples the PLA OR array output line 135a (identified as "74" inside the PLA 24) to the signal transfer line represented by the PLA bus line 143a. The output buffer stage 140a includes first and second transistors 150 and 151 formed on the integrated circuit chip and each having first and second current flow terminals and a control terminal represented by its gate terminal. The control or gate terminal of the second transistor 151 is connected to the OR array output line 135a of the PLA 24. The buffer stage 140a further includes circuit conductors formed on the integrated circuit chip and connecting the first current flow terminal (the drain terminal) of the first transistor 150 to a first voltage supply circuit point +V. These circuit conductors also connect the second current flow terminal (the source terminal) of the first transistor 150 to the first current flow terminal (the drain terminal) of the second transistor 151. These circuit conductors further connect the second current flow terminal (the source terminal) of the second transistor 151 to a second voltage supply point represented by circuit ground.

The output buffer stage 140a further includes third and fourth transistors 152 and 153 formed on the integrated circuit chip and each having first and second current flow terminals and a control terminal represented by its gate terminal. The buffer stage 140a also includes circuit conductors formed on the integrated circuit chip and connecting the first current flow terminal (the drain terminal) of the third transistor 152 to the signal transfer line represented by PLA bus line 143a. These circuit conductors further connect the second current flow terminal (the source terminal) of the third transistor 152 to the first current flow terminal (the drain terminal) of the fourth transistor 153. These circuit conductors also connect the second current flow terminal (the source terminal) of the fourth transistor 153 to the second voltage supply circuit point represented by circuit ground.

The buffer stage 140a further includes a circuit conductor formed on the integrated circuit chip and connecting the control terminal of one of the third and fourth transistors 152 and 153, in this case the gate terminal of the fourth transistor 153, to the junction 154 between the first and second transistors 150 and 151. The buffer stage 140a also includes circuitry for supplying a timing pulse to the control (gate) terminal of the first transistor 150. This circuitry includes a conductor 155 which is connected to the source of the C4 internal timing pulses for the PLA 24. The buffer stage 140a additionally includes circuitry for supplying a strobe pulse to the control (gate) terminal of the other of the third and fourth transistors, in this case to the control (gate) terminal of the third transistor 152. This circuitry includes a conductor 156 which is connected to the strobe signal line S1 for the PLA 24.

The L1 register stage 144a is a dynamic register stage. It includes a pass transistor 160 having its drain terminal connected to the PLA bus line 143a via conductor 161 and having its scurce terminal connected by way of a conductor 162 to the input circuitry of the L2 stage 145a. The pass transistor 160 is periodically rendered conductive by the A clock pulses which are supplied to the gate terminal thereof by way of a conductor 163. In the absence of an A clock pulse, the pass transistor 160 is nonconductive to isolate the output conductor 162 from the PLA bus line 143a.

The inherent capacitance of the output conductor 162 serves to store the signal value established on the output conductor 162 when the pass transistor 160 is nonconductive. As such, it provides the driving signal for the input circuitry of the L2 stage during the B clock pulse interval during which the L2 stage is loaded. When the pass transistor 160 is conductive, the signal value on the output conductor 162 follows the signal value on the PLA bus line 143a. In this regard, the inherent capacitance of the PLA bus line 143a is considerably larger than the inherent capacitance of the L1 stage output conductor 162. In a representative implementation of the invention, a PLA bus line like the bus line 143a has a capacitance on the order of 5 picofarads whereas the L1 stage output conductor 162 has a capacitance on the order of 0.15 picofarads. Thus, the inherent capacitance of the PLA bus line 143a is some 33 times larger than the inherent capacitance of the L1 output conductor 162. Thus, when the pass transistor 160 is conductive, the L1 stage output conductor 162 can respond very quickly to changes in signal level on the PLA bus line 143a.

In some respects, the inherent capacitance of the PLA bus line 143a provides the effective storage element for the L1 stage. In particular, if the operation of the CPU clock generator 15 is stopped for a brief interval of time, the inherent capacitance of the PLA bus line 143a serves to store the signal level on the PLA bus line 143a so that a valid signal value is still present on the bus line 143a when operation of the CPU clock generator 15 is resumed. The inherent capacitance of the PLA bus line 143a can store a signal value for up to several milliseconds without any harmful deterioration of such signal value. The momentary stopping of the CPU clock generator is sometimes done in some types of data processors such as, for example, in data processors wherein the timing signals for the main storage unit are derived from a separate and different clock source.

The PLA bus line precharge circuitry included within the L1 stage 144a is represented by a source follower transistor 164 having its drain terminal connected to the +V voltage source and having its source terminal connected to the PLA bus line 143a via the L1 stage input conductor 161. The precharging transistor 164 is periodically rendered conductive by the B clock pulses which are supplied to the gate terminal thereof by way of a conductor 165. When conductive, the transistor 164 enables the +V supply voltage to charge the PLA bus line 143a to a high level which is approximately equal to +V less the voltage drop across transistor 164. In the absence of a B clock pulse, the transistor 164 is nonconductive and isolates the PLA bus line 143a from the +V supply voltage point.

The precharge circuitry represented by the precharging transistor 164 need not be located in the L1 stage. The only requirement is that the precharge circuitry be connected to the PLA bus line. It can be located outside of the L1 stage if that will provide a more compact integrated circuit layout.

The L2 register stage 145a is a static register stage. The heart of such register stage 145a is a bistable circuit provided by transistors 170, 171, 172 and 173. Either one or the other, but not both, of transistors 171 and 173 will be in a conductive condition at any given moment, the particular one which is conductive serving to represent the binary value which is being stored by the register stage 145a. Note that the PLA bus lines 143a uses negative active logic. A low level on the bus line 143a represents a logical "one" value. If the register stage 145a is storing a logical "one" value from the PLA bus line 143a, then transistor 171 is conductive and transistor 173 is turned off. Conversely, if a logical "zero" (high level) from the bus line is being stored, then transistor 173 is conductive and transistor 171 is turned off.

Transistors 171 and 173 are enhancement mode type MOSFET transistors, while transistors 170 and 172 are depletion mode type MOSFET transistors. The source terminals of the depletion mode transistors 170 and 172 are connected to their respective gate terminals to provide a desired pull-up action. The cross coupling of the drain terminal of transistor 171 to the gate terminal of transistor 173 and the drain terminal of transistor 173 to the gate terminal of transistor 171 provides the desired bistable action.

The output conductor 162 from the L1 register stage is connected to the input of an inverter circuit provided by transistors 174 and 175. Transistor 174 is a depletion mode transistor and transistor 175 is an enhancement mode transistor. The source of transistor 174 is connected to its gate to provide a desired pull-up action. The junction between the inverter circuit transistors 174 and 175 drive a first input of a NAND circuit formed by transistors 176 and 177. More particularly, this junction point is connected to the gate terminal of the transistor 176. The second input of this NAND circuit is represented by the gate terminal of the transistor 177. This gate terminal is connected to the B clock pulse line via conductor 178 and controls the loading of the L2 register stage 145a. The L1 stage output conductor 162 is also connected to a first input of a NAND circuit formed by transistors 179 and 177, the second input of such NAND circuit being the gate terminal of the transistor 177 which is connected to the B clock pulse line 178.

When the B clock pulse receiving line 178 is active (at a high level), the L2 register stage 145a is set to the same logical value as appears on the L1 stage output line 162, which logical value is the same as that appearing on the PLA bus line 143a. When the B clock pulse line 178 goes inactive, this logical value is then stored by the L2 register stage 145a.

Assuming, for example, the L1 stage output line 162 is at a low voltage level (logical value of "one"), this low level is inverted by the transistor 175 to provide a high voltage value at the gate of transistor 176. At the same time, the low voltage level on the L1 stage output line 162 is supplied to the gate terminal of transistor 179. When the B clock line 178 goes active during the occurrence of a positive B clock pulse, transistor 177 is turned on and the high level at the gate of transistor 176 turns on the transistor 176. This provides a current flow path from a junction point 180 via transistors 176 and 177 to circuit ground. This places the junction point 180 at a low voltage level. This low voltage level at junction point 180 turns off bistable circuit transistor 173 in the event that it was previously conducting. At the same time, the low voltage level at the gate of transistor 179 keeps the transistor 179 turned off. The off condition of transistors 173 and 179 produces a high voltage level at the junction point 181. This high voltage level is supplied to the gate of bistable circuit transistor 171 to turn it on in the event that it was not previously turned on.

Termination of the B clock pulse on the L2 load control line 178 turns off the transistor 177. This isolates the bistable circuit transistors 171 and 173 so that they can no longer be affected by any signal on the L1 stage output line 162. The cross coupling of the bistable circuit transistors 171 and 173 enables them to preserve the logical condition that existed just before the transistor 177 was turned off. For the present example, this logical condition corresponds to a logical "one" value on the PLA bus line 143a and is represented by the transistor 171 being turned on and the transistor 173 being turned off.

In a similar manner, it can be shown that if the L1 stage output line 162 had been at a high level (logical "zero" value on bus line 143a) during the occurrence of the B clock pulse on the L2 load control line 178, then the bistable circuit transistors 171 and 173 would have been set to represent the logical "zero" condition for the PLA bus line 143a. Such condition is represented by transistor 173 being turned on and transistor 171 being turned off.

Output lines 146 and 147 of the L2 stage are connected to the bistable circuit junction points 181 and 180, respectively. These output lines 146 and 147 run to the A decoder 37 as shown in FIG. 9. The designation of which of these output lines 146 and 147 is the "true" line and which is the "complement" line depends on whether positive logic or negative logic is to be employed in the A decoder 37. If positive logic is to be employed, then a high level represents a logical "one" value and a low level represents a logical "zero" value in the decoder 37. In this case, the L2 output line 146 is designated as the "true" line and the L2 output line 147 is designated as the "complement" output line. This, of course, represents an inversion of the logic employed on the PLA bus line 143a.

The operation of the Bit 1 PLA output buffer stage 140a will now be considered. During the occurrence of the C3 internal timing pulse for the PLA 24, the PLA OR array output line 74 is unconditionally precharged to a high level via transistor 122. This causes the transistor 151 in the buffer stage 140a to conduct. This insures that the gate of transistor 153 is at a low level to keep the transistor 153 nonconductive. During this same C3 time, the PLA bus line 143a is precharged to a high level via the precharging transistor 164 in the L1 stage.

During the occurrence of the C4 internal timing pulse for the PLA 24, the OR array output line 74 is validated by turning on the validation circuit transistor 126. During this C4 validation interval, the OR array output line 74 may start to discharge to a low level, depending upon the states of the OR array transistors 116 and 120 which are driven by different product lines from the AND array portion of the PLA 24. If either of these OR array transistors 116 and 120 is conductive during the C4 validation interval, the OR array output line 74 will be discharged. Otherwise, the OR array output line 74 remains at its precharged high level.

During the C4 validation interval for the OR array output line 74, the gate of transistor 150 in the buffer stage 140a is activated by the C4 pulse. Since transistor 151 always starts in the conductive mode at the beginning of the C4 timing interval, the gate of transistor 153 always starts at a low level and will remain at a low level unless the OR array output line 74 is discharged low. In this regard, the dimensions of the transistors 150 and 151 are proportioned so that if both are conductive at the same time, the second transistor 151 will control the voltage level at the gate terminal of the transistor 153. Thus, if the OR array output line 74 is not discharged during the C4 interval, the transistor 153 will remain nonconductive even though both of transistors 150 and 151 are conductive. If, on the other hand, the OR array output line 74 is discharged to a low level during the C4 interval, the transistor 151 is turned off causing the gate of transistor 153 to go to a high level and hence placing the transistor 153 in a conductive condition.

If the PLA 24 is being selected to drive the PLA output bus 36, then an S1 strobe pulse is supplied by way of the S1 strobe line to the gate terminal of the transistor 152 during approximately the C4 validation interval for the PLA 24. The term "approximately" indicates that some skewing or misalignment of the S1 strobe pulse relative to the C4 PLA internal timing pulse is possible. If transistor 153 is also in a conductive mode (OR array output line 74 discharged) during the occurrence of the S1 strobe pulse, then the PLA bus line 143a is discharged to circuit ground by way of the series connected transistors 152 and 153. If, on the other hand, the OR array output line 74 is at a high level during the C4 validation interval, transistor 153 remains nonconductive and the occurrence of the S1 strobe pulse during this C4 interval does not cause any discharging of the PLA bus line 143a. In such case, the bus line 143a remains at its precharged high level. Thus, in either case, the validated signal level on the PLA bus line 143a is the same as the validated signal level on the OR array output line 74. If the OR array output line 74 remains high, then so does the PLA bus line 143a. If the OR array output line 74 is discharged, then so is the PLA bus line 143a, assuming of course that there is an S1 strobe pulse during the C4 validation interval.

The signal value on the PLA bus line 143a is loaded into the L1 register stage 144a by the A clock pulse which occurs during the C4 validation interval for the PLA OR array output line 74. Thus, assuming that the PLA 24 is being selected by the S1 strobe pulse, the OR array output line 74 is validated and the buffer stage transistors 150 and 152 and the L1 stage transistor 160 are turned on during one and the same C4 timing interval. As previously indicated, the PLA bus line 143a is precharged during the preceding C3 timing interval.

Since the buffer stage transistor 151 always starts in a conductive mode at the beginning of the C4 timing interval, the gate of transistor 153 will always stay at a low level until the OR array output line 74 is discharged to a low level. This insures that a false discharge of the PLA bus line 143a cannot occur at the start of the C4 time interval. This also renders the buffer stage 140a insensitive to any skewing or misalignment of the S1 strobe pulse relative to the PLA C4 timing pulse. The PLA bus line 143a cannot be affected until the occurrence of both events, namely, the appearance of the S1 strobe pulse and the discharge of the OR array output line 74. Thus, the construction of the buffer stage 140a guarantees a "glitchless" output to the PLA bus line 143a.

This PLA bus coupling mechanism provides very good transient performance because signal validation of the PLA bus line consists of discharging a pure capacitive storage element (the inherent capacitance of the bus line) through a series connection of two grounded source MOSFET devices, namely, the MOSFET transistors 152 and 153. This arrangement provides a very fast discharging action.

A further advantage of this PLA output bus coupling mechanism is that it provides a minimum of power dissipation in the buffer stage 140a. For one thing, no direct-current power is dissipated in the buffer stage 140a when the OR array output line 74 is at a low level. Furthermore, even when the OR array output line 74 is at a high level, direct-current power is dissipated in the buffer stage 140a only during the occurrence of the C4 timing pulse at the gate of the transistor 150. At best, this occurs somewhat less than 25% of the time since the C4 timing pulse occurs somewhat less than 25% of the time. Since many such buffer stages are used in the control unit 14, the savings in power dissipation is rather significant.

Each of the individual buffer stages in each of the PLA output buffers 32,33,34,40,41 and 42 shown in FIG. 3 are of the same construction as that shown for the buffer stage 140a in FIG. 10. Each of the individual L1 stages in each of the L1 control registers 35a and 43a are of the same construction as that shown for the L1 stage 144a in FIG. 10. Each of the individual L2 stages in each of the L2 control registers 35b and 43b are of the same construction as shown in FIG. 10 for the L2 stage 145a.

DESCRIPTION OF THE FIG. 11 CONTROL UNIT

Referring to FIGS. 11.1 and 11.2 (collectively referred to as FIG. 11), there is shown a functional block diagram of a further embodiment of a digital control system or control unit constructed in accordance with the present invention. This control unit of FIG. 11 may be used as the control unit 14 in the FIG. 1 data processor. This control unit of FIG. 11 is generally similar in construction and operation to the control unit of FIG. 3 with a primary difference being that the control unit of FIG. 11 uses a greater number of programmable logic arrays (PLA's). The pertinent differences will be pointed out in the following discussion. All of the structure shown in FIG. 11, with the possible exception of some or all of the clock generator 15, is fabricated on one and the same LSI integrated circuit chip.

The improved digital control system of FIG. 11 includes first and second sets of programmable logic array (PLA) mechanisms wherein each PLA mechanism is responsive to the processor instruction to be executed for producing at least one of the microwords needed to execute such instruction. The first set of PLA mechanisms includes a first cycle PLA 201, effective address decode PLA's 202 and 203 and execute decode PLA's 204 and 205. For simplicity, these first set PLA's will sometimes be referred to by the acronyms P1, PAA, PAC, PXA and PXC, respectively. The second set of PLA mechanisms includes a second cycle PLA 206, effective address decode PLA's 207 and 208 and execute decode PLA's 209 and 210. For simplicity, these second set PLA's will sometimes be referred to by the acronyms P2, PAB, PAD, PXB and PXD respectively.

Each of these PLA's 201-210 is a dynamic or clocked PLA and each is of the same general construction as indicated in FIG. 6. As such, each employs internal C1, C2, C3 and C4 clocking pulses for controlling the internal operations therein.

The improved digital control unit of FIG. 11 further includes first and second control mechanisms for respectively receiving the microwords from the first and second sets of PLA mechanisms for producing for each microword at least one control point signal for controlling the operation of the data processor. The first control mechanism includes an A-L1 control register 211, an A-L2 control register 212 and an A decoder 213 for receiving the microwords from the first set of PLA's 201-205 via a first PLA output bus 214. The second control mechanism includes a B-L1 control register 215, a B-L2 control register 216 and a B decoder 217 for receiving the microwords from the second set of PLA's 206-210 via a second PLA output bus 218.

The control unit of FIG. 11 also includes first multiplexing circuitry for transferring microwords one at a time from the different ones of the PLA's 201-205 in the first set to the first control mechanism 211-213. This first multiplexing circuitry includes a plurality of selectively operable output buffers (gates) 221-225 for individually coupling the outputs of the different PLA's 201-205 to the input of the A-L1 control register 211 via the PLA output bus 214. These buffers or gates 221-225 are selectively enabled by respective ones of PLA strobes S1, SAA, SAC, SXA and SXC, which PLA strobes are obtained from the output of the A decoder 213. Only one of the strobe signal lines S1, SAA, SAC, SXA and SXC is activated during any given microword cycle, the particular strobe line which is activated being determined by the coding of the PLA strobe field of the microword resident in the A-L2 control register 212.

The control unit of FIG. 11 further includes second multiplexing circuitry for transferring microwords one at a time from different ones of the PLA's 206-210 in the second set to the second control mechanism 215-217. This second multiplexing circuitry includes a plurality of selectively operable output buffers (gates) 226-230 for individually coupling the outputs of the different PLA's 206-210 to the input of the B-L1 control register 215 via the PLA output bus 218. These buffers or gates 226-230 are selectively enabled by respective ones of PLA output strobes S2, SAB, SAD, SXB and SXD which are obtained from the output of the B decoder 217. Only one of these strobe signal lines S2, SAB, SAD, SXB and SXD will be activated during any given microword control cycle, the particular strobe line which is activated being determined by the coding of the PLA strobe field of the microword resident in the B-L2 control register 216 for that particular control cycle.

The control system of FIG. 11 further includes third multiplexing circuitry for interleaving the control point signals produced by the first control mechanism 211-213 with the control point signals produced by the second control mechanism 215-217 so that these two control mechanisms may take turns in controlling the operation of the data processor. This third multiplexing circuitry includes a multi-stage set of A gates 231 for the A decoder 213 and a multi-stage set of B gates 232 for the B decoder 217. A gates 231 are periodically enabled by the positive A clock pulses from the clock generator 15, while the B gates 232 are periodically enabled by the positive B clock pulses from the clock generator 15. Thus, the control point signals from the A decoder 213 control the data processor during the A clock pulse intervals and the control point signals from the B decoder 217 control the data processor during the B clock pulse intervals. In this manner, the control point signals from the two decoders 213 and 217 are interleaved to take turns in controlling the data processor.

As in the FIG. 3 embodiment, the first and second cycle PLA's 201 and 206 are driven directly from the instruction register 20 in the data processor of FIG. 1. This enables them to react very quickly to new processor instructions. The set of four effective address decode PLA's 202, 203, 207 and 208, on the other hand, receive their processor instruction dependent inputs by way of an effective address encode PLA 233 and a register 234. For simplicity, the encode PLA 233 is assumed to be a static PLA. In response to the processor instruction received via bus 21, encode PLA 233 produces an instruction identification (ID) number having a lesser number of bits than does the processor instruction supplied to the input of the encode PLA 233 by way of the bus 21. This instruction ID number is loaded into the register 234 by an Sφ restart pulse obtained at the appropriate moment from the output of the B decoder 217. The instruction ID number in register 234 is supplied in parallel to a first set of inputs of the AND array portions in each of the effective address decode PLA's 202, 203, 207 and 208.

An effective address sequence counter 235 and a sequence count register 236 supply the sequences of number signals to the second sets of inputs for the AND array portions of the effective address decode PLA's 202, 203, 207 and 208. Sequence counter 235 is reset to a zero condition by the same Sφ restart pulse that loaded the encode PLA output register 234. Depending upon the number of microwords needed from the address decode PLA's, the address sequence counter 235 is incremented one or more times by the SAB strobe pulses obtained from the B decoder 217. The sequence count value in counter 235 is supplied directly to the second sets of inputs of the address decode PLA's 202 and 207. It is supplied by way of register 236 to the second inputs of the other two address decode PLA's 203 and 208. Register 236 is reset to zero by the Sφ restart pulse and is loaded with the sequence count value from counter 235 by the SAC strobe pulse obtained from the A decoder 213.

The set of four execute decode PLA's 204, 205, 209 and 210 are driven in a similar manner by an execute encode PLA 237 and an execute sequence counter 238. The execute encode PLA 237 produces an instruction ID number which is loaded into register 239 by the Sφ restart pulse. This instruction ID number is supplied to the first inputs of each of the execute decode PLA's 204, 205, 209 and 210. The execute sequence counter is reset to a zero value by the Sφ restart pulse and is incremented one or more times by SXB strobe pulses obtained from the B decoder 217. The sequence count numbers from the counter 238 are supplied directly to the second inputs of the execute decode PLA's 204 and 209. They are supplied to the second inputs of the other two execute decode PLA's 205 and 210 by way of register 240. For this embodiment, the execute encode PLA 237 is also assumed to be a static PLA.

Figures 12, 14:
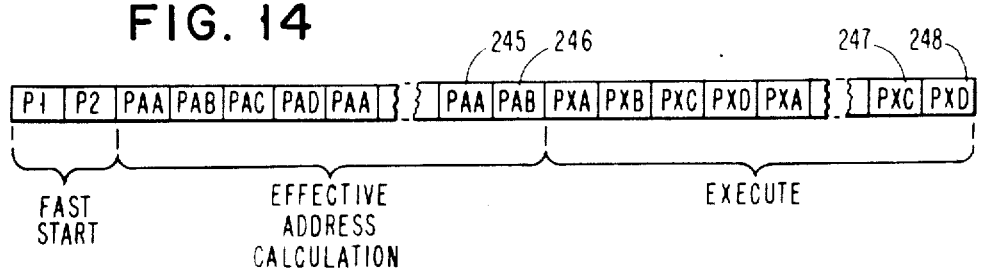
FIG. 12 is a chart used in explaining the internal clocking signal timing of the various dynamic programmable logic arrays of FIG. 11.
FIG. 14 is a timing diagram showing a typical sequence of control words for the control unit of FIG. 11.

The internal C1, C2, C3 and C4 timing pulses for each of the various dynamic PLA's 201-210 are derived from PLA clock signals PC1-PC16 produced by PLA clock logic 242. A different set of four of these PLA clock signals PC1-PC16 is supplied to each of the PLA's 201-210. The table of FIG. 12 shows which PLA clock signals are supplied to each of the different PLA's 201-210. As indicated in FIG. 12, the first cycle PLA 201, for example, receives the PLA clock signals PC1-PC4. These clock signals PC1-PC4 provide the internal timing signals C1-C4, respectively, needed within the P1 first cycle PLA 201.

The PLA clock logic 242 receives as input signals the various PLA output strobes S1, S2, SAA, SAB, SAC, SAD, SXA, SXB, SXC, and SXD. It further receives as input signals the positive A and B clock pulses from the clock generator 15 and the Sφ restart pulse from the B decoder 217. The PLA clock logic 242 includes therein various combinatorial logic circuits which make use of these various input signals to produce the PLA clock signals PC1-PC16. The table of FIG. 13 shows the combinatorial logic provided within the PLA clock logic 242 for producing each of these PLA clock signals PC1-PC16. The "dot" symbol in FIG. 13 represents the logical AND function and the "+" symbol represents the logical OR function. For sake of comparison, the PC1-PC9 PLA clock signals for the FIG. 11 embodiment are generated in the same manner as were the PC1-PC9 PLA clock signals in the FIG. 3 embodiment.

FIG. 14 represents the general nature of the overall control word or microword sequence produced by the control unit of FIG. 11 for each processor instruction when it is resident in the instruction register 20 of FIG. 1. Each block in the graph of FIG. 14 represents a microword. The acronym in the block identifies the specific one of the PLA's 201-210 from which that microword was obtained. The first and second microwords P1 and P2 for each processor instruction are provided by the first and second cycle PLA's 201 and 206, respectively. Thereafter, a series of microwords PAA, PAB, PAC, PAD, PAA, PAB, ..., are provided by the effective address decode PLA's 202, 203, 207 and 208. In general, the effective address microwords are used to perform the effective address calculations for the operand or operands to be manipulated and to fetch such operands from the main storage unit 12.

Following completion of the effective address calculation sequence of microwords, the execute decode PLA's 204, 205, 209 and 210 become operative to produce a sequence of "execute" microwords PXA, PXB, PXC, PXD, PXA, PXB, ..., which are, in general, effective to "execute" the processor instruction, that is, to perform the desired operand manipulation or manipulations called for by the processor instruction. After the operand manipulations, the last few "execute" microwords may be used to perform any housekeeping chores that may need to be done to complete the overall microword sequence and to prepare for the coming of the next processor instruction.

The exact number of microwords in the effective address portion of the overall sequence will, in general, be different for different processor instructions. In a similar manner, the exact number of microwords in the execute portion of the overall sequence will also be different for different processor instructions. The last microword in the effective address segment to drive the A decoder 213, in this example, the microword 245, will produce a PLA strobe SXA to select the PXA decode PLA 204 to be the source of the next microword for the A decoder 213. In a similar manner, the last microword in the effective address segment to drive the B decoder 217, in this case, the microword 246, will produce a PLA strobe SXB to select the PXB decode PLA 209 to provide the next microword for the B decoder 217. This accomplishes the switchover from the effective address segment to the execute segment of the microword sequence. Thereafter, and up until the last two microwords in the execute segment, the microword from each execute decode PLA produces a PLA strobe which selects the next execute decode PLA which is to supply the microword for its respective control register and decoder mechanism. The last A decoder microword in the execute segment, in this example, the microword 247, produces a PLA strobe S1 for selecting the first cycle PLA 201. In a corresponding manner, the last B decoder microword in the execute segment, in this example, the microword 248, produces a PLA strobe S2 for selecting the second cycle PLA 206. In this manner, the last two microwords for the current processor instruction select the sources of the first two microwords for the next processor instruction to be executed.

The distinction between the processor control actions provided by the effective address microwords and the execute microwords is not a hard and fast one. For example, for some processor instructions some of the effective address calculations microwords may, in fact, be performing functions which are more properly classified as execute functions. In other cases, some of the execute microwords may be performing functions which might more properly be grouped with the effective address functions. One reason for not adhering to a strict segregation of functions is to even out the distribution of the microwords so that all of the address and execute decode PLA's may be of approximately the same physical size. This keeps any one of these PLA's from becoming much larger in size than the remainder of the PLA's.

DESCRIPTION OF THE FIG. 15 RESTART AND REFRESH CIRCUITS

Figure 15:
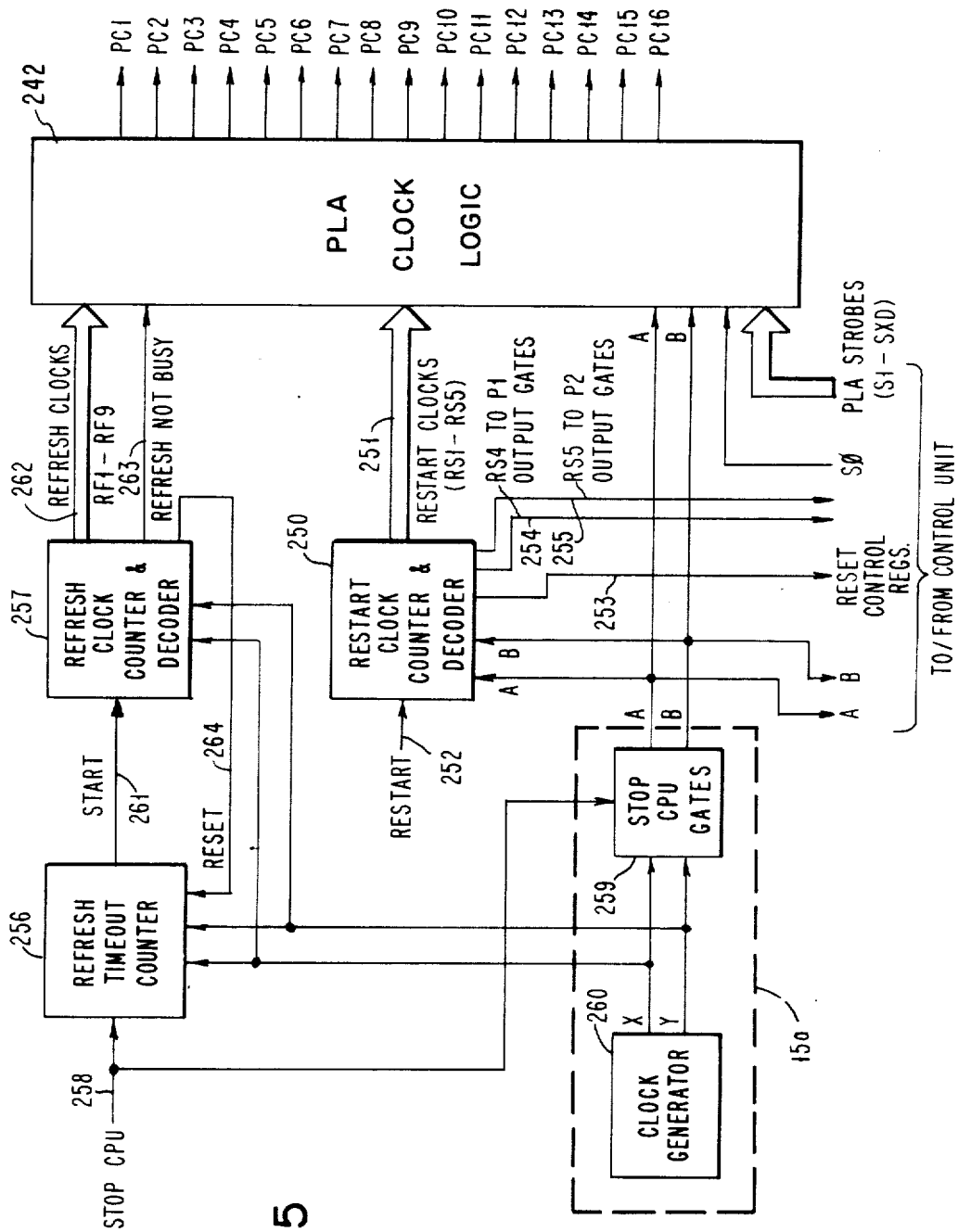
FIG. 15 is a functional block diagram showing certain restart circuitry and certain refresh circuitry which may be used with the PLA clock logic circuitry of FIG. 11.

Referring to FIG. 15, there is shown restart circuitry and refresh circuitry which may be used with the PLA clock logic 242 of the FIG. 11 control unit. The restart circuitry is represented by a restart clock counter and decoder unit 250 which can be activated to produce a series of restart clocking pulses RS1 through RS5 which are supplied to the PLA clock logic 242 for purposes of restarting the operation of the dynamic PLA's 201-210. The nature of these restart clocking pulses RS1-RS5 is indicated in the timing diagram of FIG. 16. Each is produced on a separate output line in a bus 251 which runs to the PLA clock logic 242. Each of these restart clocking pulses is supplied to a different one of the combinatorial logic circuits in the PLA clock logic 242. As will be seen, these five restart clocking pulses are supplied to the respective ones of the five combinatorial logic circuits which produce the PC1-PC5 PLA clocking pulses.

Figure 16:
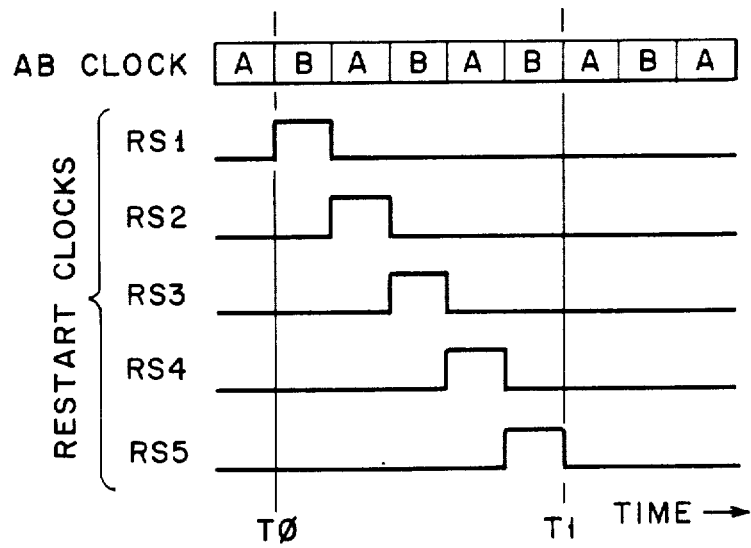
FIG. 16 is a timing diagram showing the general nature of the PLA restart clocking signals produced by the restart circuitry of FIG. 15.

The restart circuitry is activated by applying a restart signal to an input control line 252. In response thereto, the restart circuitry 250 produces one set of five restart clocking pulses as shown in FIG. 16. The restart signal causes a counter in the restart circuitry 250 to commence counting the A and B clock pulses which are supplied thereto from the master clock generator 15a. Decoder circuitry in the restart circuitry 250 responds to five consecutive count conditions in the counter to consecutively activate the five restart clock lines RS1-RS5 in the manner indicated in FIG. 16. This activation is synchronized with the A and B clock pulses in the manner indicated in FIG. 16 such that the RS1 restart pulse occurs during a B clock interval, the RS2 restart pulse occurs during an A clock interval, and so forth.

With reference to the timing diagram of FIG. 4.2, which timing diagram is also valid for the FIG. 11 control unit, the RS1 restart pulse produces a PC1 PLA clocking pulse, the RS2 restart pulse produces a PC2 clocking pulse, the RS3 restart pulse produces a PC3 clocking pulse, the RS4 restart pulse produces a PC4 clocking pulse and the RS5 restart pulse produces a PC5 clocking pulse. As seen from the "PLA Internal Timing" sequences shown toward the bottom (FIG. 4.3 portion) of FIG. 4, this causes a complete validation of the first and second cycle PLA's 201 and 206 of FIG. 11. It also commences the validation processes for the PAA, PAB, and PAC address decode PLA's 202, 207 and 203, these PLA's corresponding to the AP, BP and CP PLA's, respectively, in FIG. 4. The moment in time identified as T1 in FIG. 16 corresponds in FIG. 4 to the boundary line marking the beginning of a microword sequence for a processor instruction. From this point on, the PLA clocks are generated by the PLA strobe pulses produced by the microwords themselves.

The restart circuitry 250 also supplies a reset signal via line 253 to each of the control registers 211,212,215 and 216 in the FIG. 11 control unit to clear these registers so that no PLA strobe pulses are produced while the restart circuitry 250 is generating the restart clocking pulses RS1-RS5. The RS4 restart pulse is also supplied by way of line 254 to the S1 strobe input terminal for the first cycle PLA (P1) output gates 221. The RS4 restart pulse line 254 is OR'ed with the S1 strobe line for this purpose. This enables the gates 221 to pass the output of the first cycle PLA 201, which output is valid at this point in time, to the A-L1 control register 211. In a similar vein, the RS5 restart pulse is also supplied via line 255 to the S2 strobe input for the second cycle PLA (P2) output gates 226. In other words, this RS5 restart line 255 is OR'ed with the S2 strobe line for the gates 226. This enables gates 226 to transfer the validated output of the second cycle PLA 206 to the B-L1 control register 215.

The restart signal applied to the restart terminal 252 of the restart circuitry 250 may be, for example, a so-called "power-on-reset" signal or a so-called "system reset" signal of the kind normally produced by a data processor for the initial start-up of the processor or for the resetting of the processor for diagnostic purposes and the like. The "system reset" type of restart may also be generated by the data processor following an interrupt caused by a hardware error for purposes of retrying the instruction that failed.

During the normal operation of the data processor, the various dynamic PLA's 201-210 are supplied with the PLA clocking pulses PC1-PC16 in a sufficiently timely manner as a result of the strobe pulses S1-SXD produced by the A and B decoders 213 and 217 such that there is no problem with loss or impairment of microword bit values because of the discharge of the capacitive output stages of the dynamic PLA's. The discharge time constants of the PLA output stages are sufficiently long so that no problems are encountered during the normal operation of the control unit.

In some types of data processors, there are occasions when it is desired to temporarily suspend the operation of the principal data flow portion of the processor. This is accomplished by temporarily suspending the operation of the control unit. This kind of situation can occur, for example, in data processors wherein either the main storage unit or the I/O channel unit is capable of performing some operations independently of the main data flow unit. In such cases, it will at times be desirable to temporarily stop the data flow unit in order to wait for the main storage unit or the I/O channel unit to complete some related operations.

When the operation of the control unit of FIG. 11 is suspended, no new PLA clocking pulses PC1-PC16 are supplied to the dynamic PLA's 201-210. If this idle condition is allowed to continue for too long of a time interval (on the order of several microseconds), the capacitive output stages of the dynamic PLA's will have discharged to a point where their output signals are no longer reliable. For sake of comparison, the basic microword cycle time shown in FIGS. 4 and 16 is, for example, 50 nanoseconds. In this case, one microsecond corresponds to 20 microword cycles.

When operation of the control unit is resumed following a temporary suspension of operation, it is desirable that the operation resume at the same point it was at when it was suspended. In other words, if operations were suspended at the end of, for example, microword 6 of a particular processor instruction, then it is desired that when operations are resumed, they will commence with microword 7 of such instruction. In order to do this, it is necessary to preserve the validity of the outputs of the dynamic PLA's 201-210. For this reason, the FIG. 15 circuitry includes refresh circuitry which is active during the suspension of the control unit operation for periodically supplying a burst or sequence of refresh clocking signals to the PLA clocking circuitry 242 for purposes of refreshing the various dynamic PLA's 201-210. In the present embodiment, this refresh circuitry includes a refresh timeout counter 256 and a refresh clock counter and decoder unit 257.

The stopping of the data processor is accomplished by applying a "Stop CPU" signal to a stop CPU line 258. This signal is supplied to a pair of stop CPU gate circuits 259 which are connected to the outputs of the master CPU clock generator 260. Units 259 and 260 make up a clock generator 15a which is a modified version of the clock generator 15 shown in FIG. 11, the modification being the addition of the stop CPU gates 259. In other words, the clock generator 15a of FIG. 15 is intended to correspond to the clock generator 15 of FIG. 11 and, as such, supplies the basic A and B clock signals to the various units indicated in FIG. 11.

The occurrence of the stop CPU signal on line 258 disables the stop CPU gates 259 which, in turn, stops the supplying of the A and B clock signals to the control unit of FIG. 11. This freezes the control unit 11 in its tracks. More precisely, this brings the control unit to a halt with the various signal conditions existing at the moment of stopping being preserved. Since the control unit provides the control point signals for the primary data flow unit, this also brings the primary data flow unit to a halt.

The occurrence of the stop CPU signal on line 258 causes a start-up of the refresh timeout counter 256. The timeout counter 256 then commences to count the X and Y clock pulses from the clock generator 260. At the end of a predetermined time interval of, for example, two microseconds, the timeout counter 256 produces an output signal on line 261, which signal is labeled as a "Start" signal.

Figure 17:
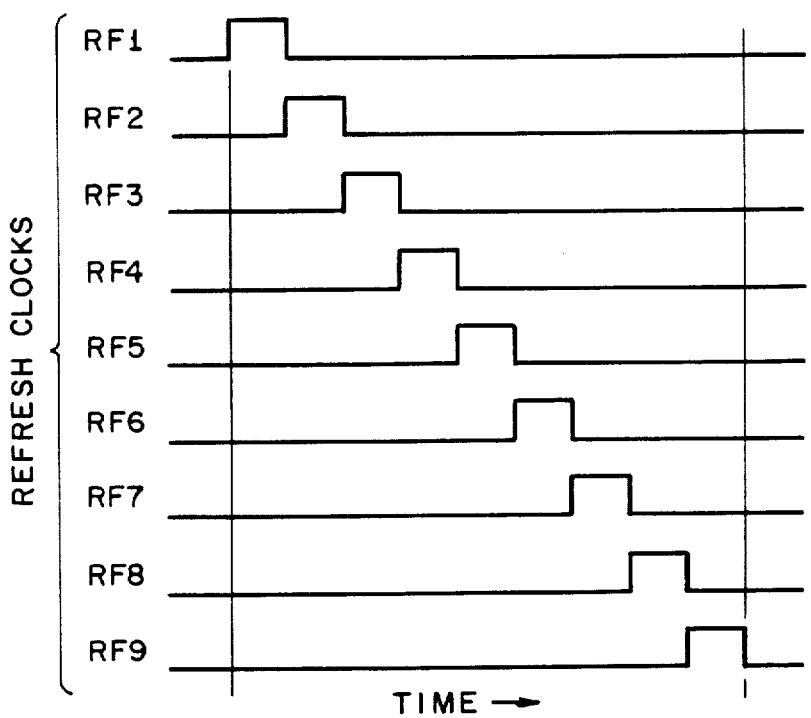
FIG. 17 is a timing diagram showing the general nature of the PLA refresh clocking signals produced by the refresh circuitry of FIG. 15.

The appearance of the start signal on line 261 starts the internal operation of the refresh clock counter and decoder unit 257. In response to the start signal on line 261, the refresh clock unit 257 produces a burst of nine consecutive refresh clocking pulses RF1 through RF9. The general nature of these refresh clocking pulses is shown in FIG. 17. Each such pulse is of, for example, 50 nanoseconds duration. These pulses are supplied by way of separate output lines in a bus 262 to the PLA clock logic 242 for purposes of producing refresh clocking pulses on the various PLA clock output lines PC1-PC16 of the PLA clock logic 242. The refresh clock unit 257 also supplies a "Refresh Not Busy" signal via line 263 to the PLA clock logic 242 for purposes of disabling the portions of the PLA clock logic circuitry which normally respond to the S1-SXD PLA strobe pulses.

After the set of nine consecutive refresh pulses shown in FIG. 17 is produced, the refresh clock unit 257 supplies a reset signal to the timeout counter 256 by way of line 264. This resets timeout counter 256, whereupon the timeout counter 256 commences to count out another two microsecond time interval, provided the Stop CPU signal is still present on line 258. So long as the Stop CPU signal remains active on the stop CPU line 258, the timeout counter 256 will continue to count out the two microsecond time intervals and to produce a start signal on lines 261 at the end of each such two microsecond time interval. In this manner, once every two microseconds, the refresh clock unit 257 is caused to generate a burst of nine consecutive refresh clocking pulses RF1-RF9. These refresh pulses keep the dynamic PLA's 201-210 refreshed.

When the Stop CPU signal on line 258 is turned off, the timeout counter 256 is disabled so that no more start signals are supplied to the refresh clock unit 257. Deactivation of the Stop CPU signal on line 258 also reenables the stop CPU gates 259 to resume the supplying of the master A and B clock signals to the control unit of FIG. 11. This, in turn, causes the control unit of FIG. 11 to resume its normal operation.

PLA CLOCK LOGIC CIRCUITS OF FIGS. 18-33

FIGS. 18-33 show in greater detail the construction of the individual combinatorial logic circuits which make up the PLA clock logic 242 of FIGS. 11 and 15. There is a separate combinatorial logic circuit for each of the PLA clock pulse lines PC1-PC16, these circuits being individually shown in FIGS. 18-33, respectively. The operation of the combinatorial logic circuits of FIGS. 18-33 is pretty much self explanatory. For sake of completeness, however, the operation of, for example, the PC1 circuit of FIG. 18 will be described in some detail.

Figure 18:
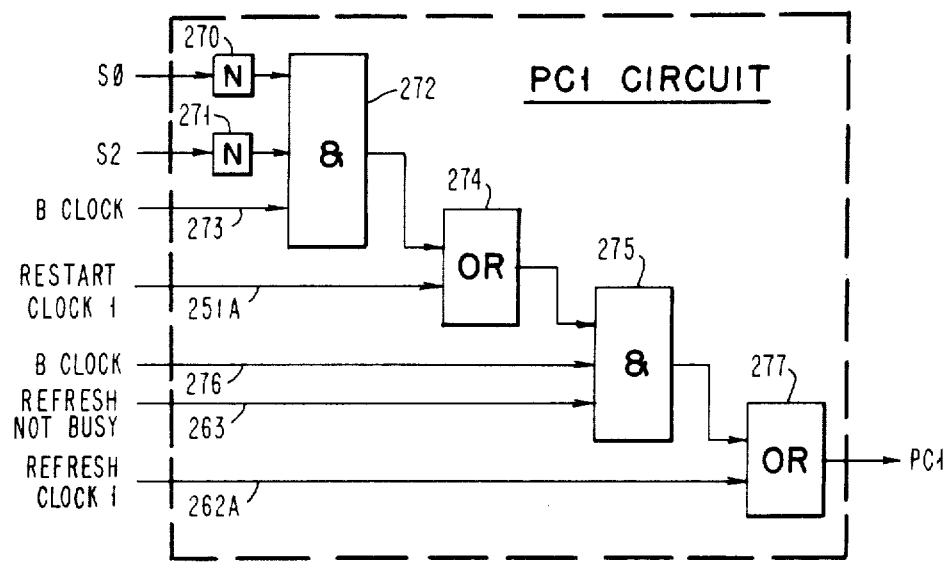
FIGS. 18 through 33 show the construction of the different individual combinatorial logic circuits which are used in the PLA clock logic of FIG. 11 to produce the different PLA clocking signals PC1 through PC16.
Figure 19:
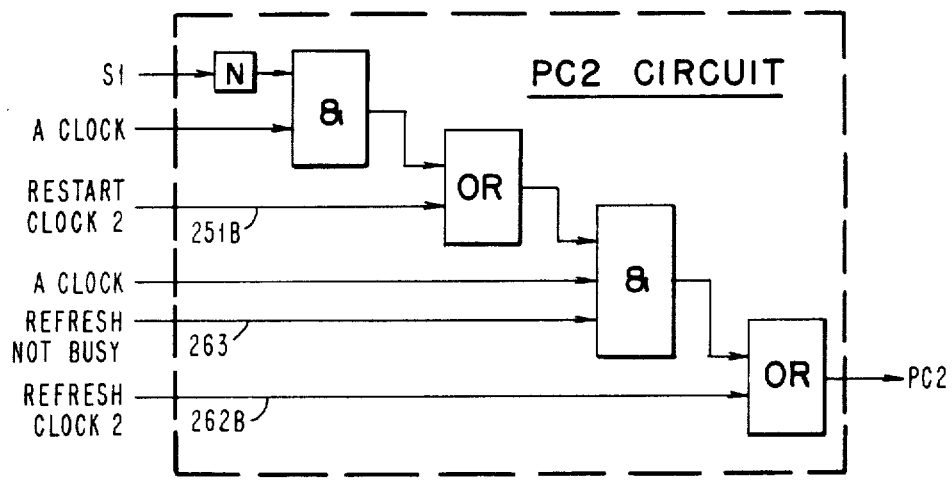
Figure 20:
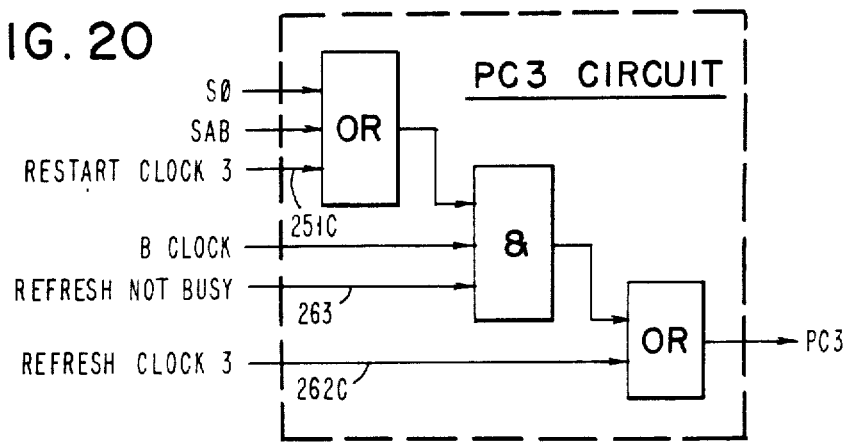
Figure 21:
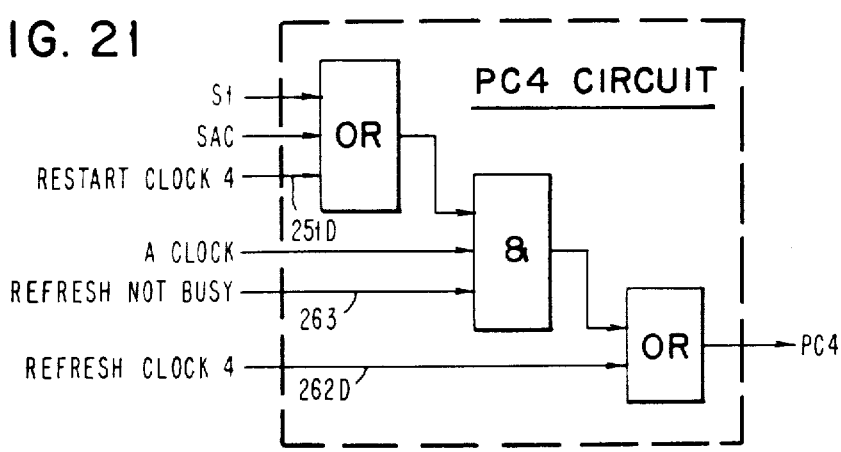
Figure 22:
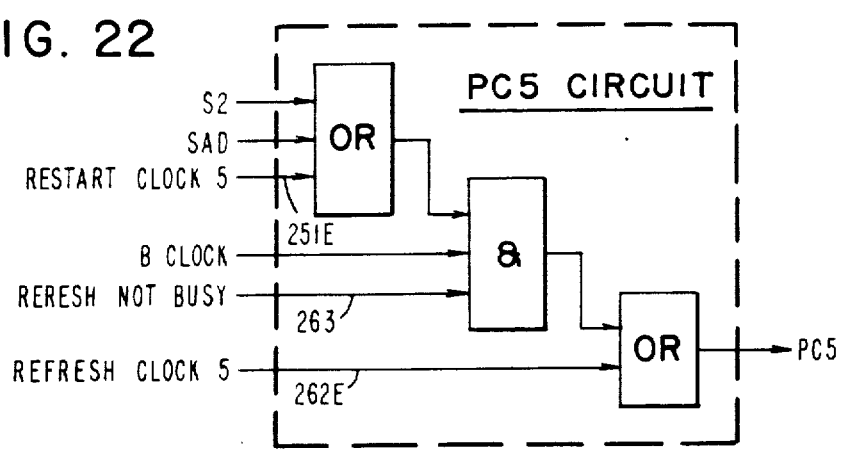
Figure 23:
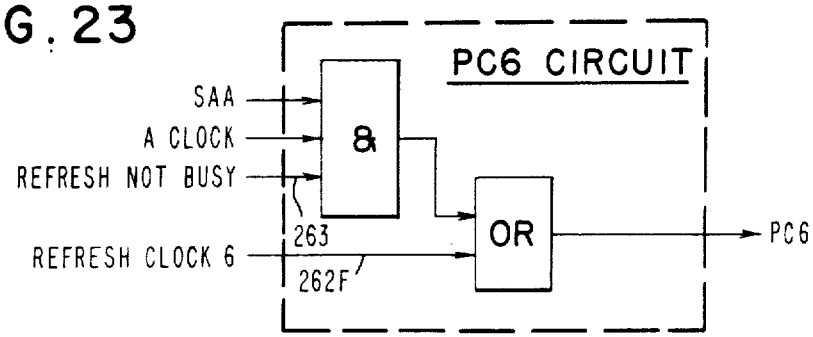
Figure 24:
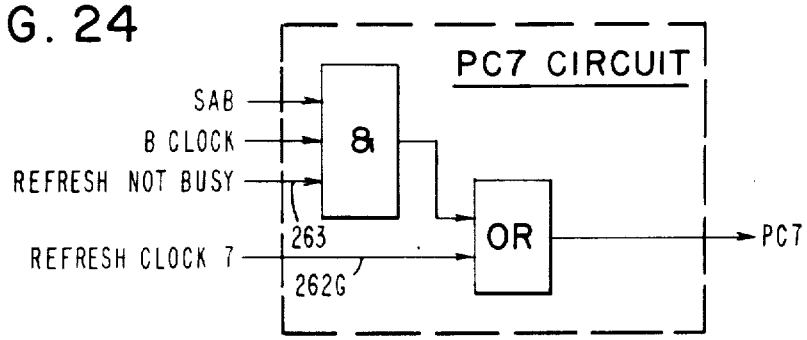
Figure 25:
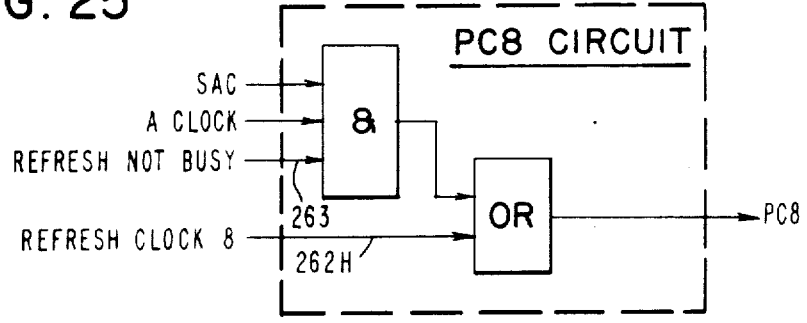
Figure 26:
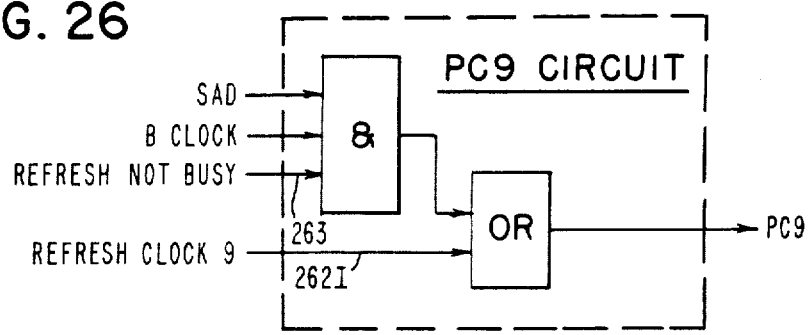
Figure 27:
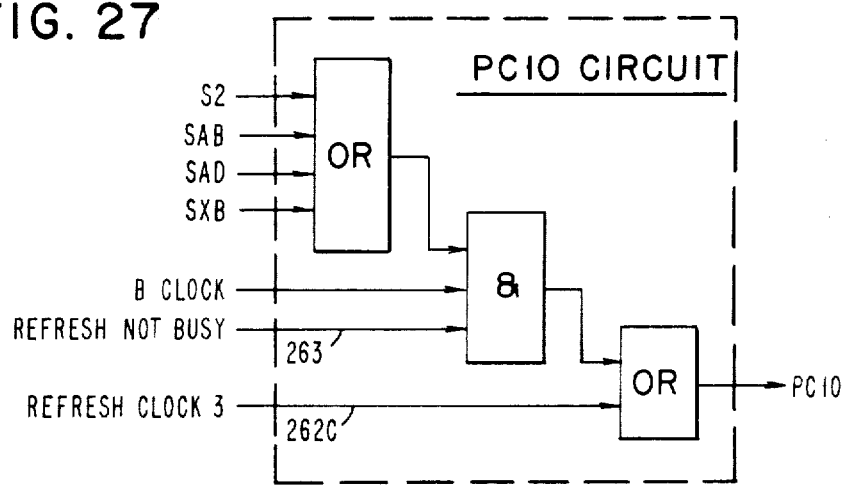
Figure 28:
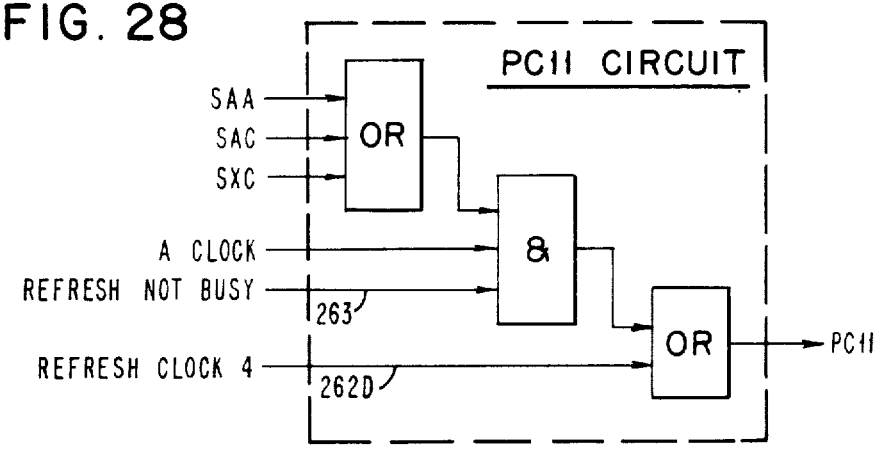
Figure 29:
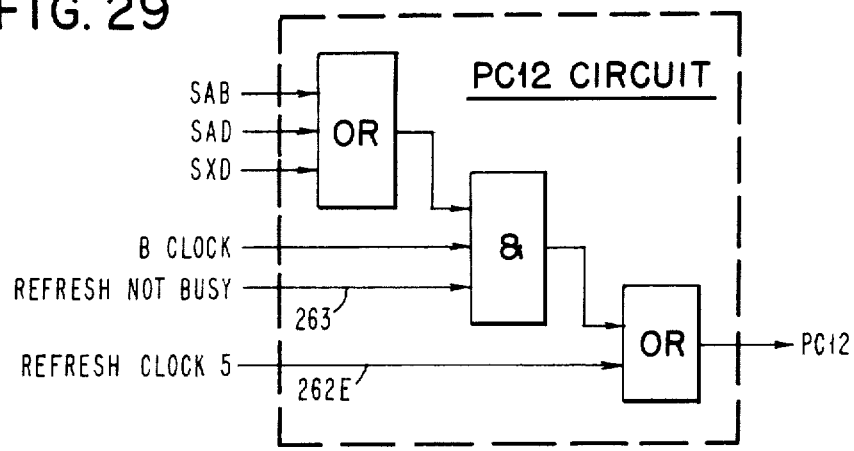
Figure 30:
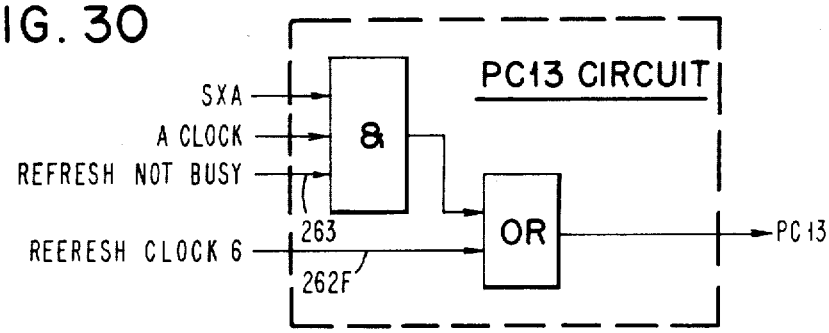
Figure 31:
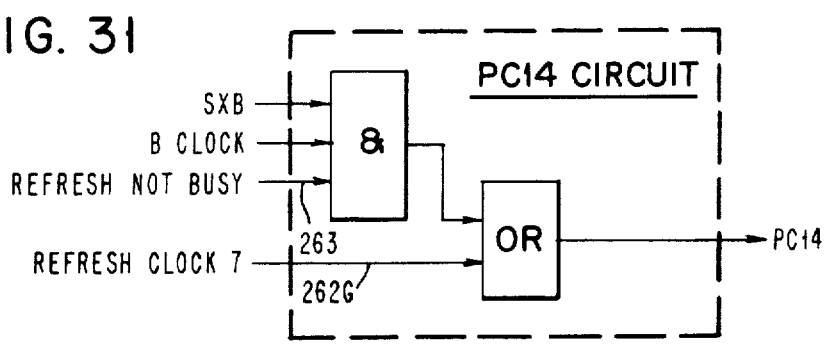
Figure 32:
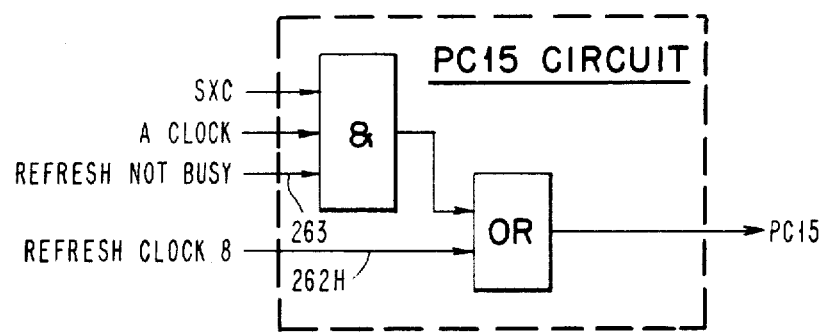
Figure 33:
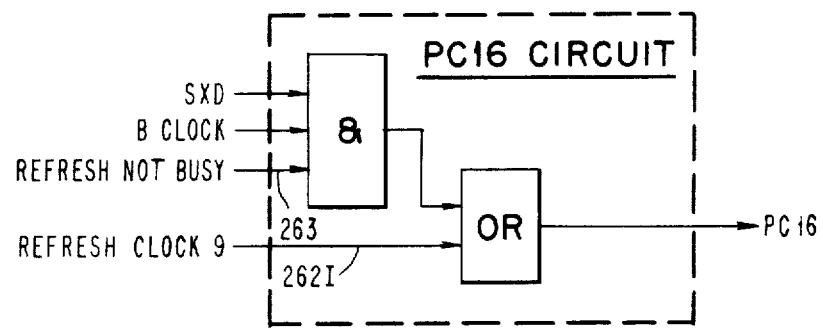

Referring to FIG. 18, the RS1 restart clock line 251a and the RF1 refresh clock line 262a are normally inactive. In the present embodiment, this means that they are normally at a low signal level. The "Refresh Not Busy" line 263, on the other hand, is normally active and at a high signal level. The Sφ and the S2 strobe signal lines from the B gates 232 of FIG. 11 are connected by way of respective inverter circuits or NOT circuits 270 and 271 to an AND circuit 272. The B clock pulses from the clock generator 15a are supplied by way of line 273 to a third input of the AND circuit 272. The output of AND circuit 272 represents the clock logic function shown in the chart of FIG. 13 for the PC1 PLA clock. Thus, each B clock pulse on line 273 produces a pulse at the output of AND circuit 272 so long as there are no Sφ or S2 strobe pulses.

The pulses appearing at the output of AND circuit 272 are supplied by way of an OR circuit 274 to a first input of an AND circuit 275. The B clock pulses from the clock generator 15a are also supplied to the AND circuit 275 by way of line 276. Assuming the "Refresh Not Busy" line 263 to be at its normal high signal level, there is produced at the output of AND circuit 275 a set of pulses which correspond to the set of pulses appearing at the output of AND circuit 272. These pulses are supplied by way of an OR circuit 277 to the PC1 clock line to provide thereon the normal PC1 PLA clocking pulses which, as indicated by the table of FIG. 12, are supplied to the C1 clock terminal of the P1 dynamic first cycle PLA 201.

If the restart clock circuitry 250 is active, then the RS1 restart clocking pulse is supplied by way of line 251a, OR circuit 274, AND circuit 275 and OR circuit 277 to the PC1 clock line. If the refresh clock circuitry 257 is active and operating to produce the refresh clocking pulses, then the "Refresh Not Busy" line 263 goes to a low signal level. This disables the AND circuit 275 to block the passage of any clocking pulses produced by either the AND circuit 272 or the restart clock circuitry 250. In this case, the RF1 refresh pulse is supplied by way of line 262a and the OR circuit 277 to the PC1 clock line for purposes of providing part of the refreshing of the first cycle PLA 201.

A few general comments are in order. The PC2-PC16 clock circuits of FIGS. 19-33, respectively, implement their respective part of the PLA clock logic given in the chart of FIG. 13. The RS1-RS5 restart clock pulses are respectively and only supplied to the PC1-PC5 clock circuits of FIGS. 18-22. The RF1-RF9 refresh clock pulses are respectively supplied to the PC1-PC9 clock circuits of FIGS. 18-26. The RF3-RF9 refresh clock pulses are also supplied in a respective manner to the PC10-PC16 clock circuits of FIGS. 27-33. The "Refresh Not Busy" signal on line 263 is supplied to all of the PC1-PC16 clock circuits.

A point to note is that the PLA clock logic 242 includes only combinatorial logic circuitry. As is well known to those skilled in the art, other forms of equivalent combinatorial logic circuitry may be used in place of the AND and OR circuitry shown in FIGS. 18-33.

The PLA clock logic 60 of the FIG. 3 embodiment may be constructed in the same manner as shown in FIGS. 18-33 except, of course, that only the PC1-PC9 circuits of FIGS. 18-26 are used in the FIG. 3 embodiment.

While there have been described what are presently considered to be preferred embodiments of this invention, it will be obvious to those skilled in the art that various changes and modifications may be made therein without departing from the invention, and it is, therefore, intended to cover all such changes and modifications as fall within the true spirit and scope of the invention.

What is claimed is:

1. In a digital control unit wherein a sequence of control words are used to produce successive groups of control point signals, the combination comprising:

a plurality of dynamic programmable logic arrays for individually producing different ones of the control words, each such control word including a strobe field which is coded to identify a programmable logic array other than the one which produced it;

control circuitry responsive to the control words for producing control point signals and including circuitry responsive to the strobe field in each control word for producing a strobe signal for selecting the next programmable logic array to supply a control word to the control circuitry;

and clocking circuitry responsive to the strobe signals produced by the control circuitry for producing clocking signals for the dynamic programmable logic arrays.

2. The combination of claim 1 wherein each dynamic programmable logic array includes an input AND array, an output OR array and multiple product lines interconnecting the AND and OR arrays.

3. The combination of claim 1 wherein each dynamic programmable logic array requires a plurality of successive clocking pulses in order to produce a valid control word and wherein the clocking circuitry is responsive to the strobe signals for producing the plurality of successive clocking pulses for each of the dynamic programmable logic arrays.

4. The combination of claim 3 wherein the clocking pulses for the different dynamic programmable logic arrays are offset but overlapped in time relative to one another.

5. The combination of claim 3 wherein a set of four successive clocking pulses are required by each dynamic programmable logic array in order to produce a valid control word.

6. The combination of claim 1 wherein the control circuitry includes decoder circuitry for decoding at least a portion of each control word for controlling the production of at least some of the control point signals.

7. The combination of claim 1 wherein the control circuitry includes:

a control register mechanism for receiving control words one at a time from the programmable logic arrays;

and decoder circuitry responsive to the control word appearing at the output of the control register mechanism for controlling the production of at least some of the control point signals.

8. The combination of claim 1 wherein the clocking circuitry includes only combinatorial logic circuitry for producing the clocking signals for the dynamic programmable logic arrays.

9. The combination of claim 8 wherein the clocking circuitry includes a plurality of combinatorial logic circuits each responsive to at least one of the strobe signals for producing a different one of the clocking signals needed by the dynamic programmable logic arrays.

10. The combination of claim 1 wherein the clocking circuitry includes:

circuitry responsive to the strobe signals for producing a set of clocking signals;

and circuitry for supplying a different subset of the clocking signals to each of the different dynamic programmable logic arrays for providing the internal clocking signals needed therein.

11. The combination of claim 1 wherein:

the combination includes restart circuitry which can be activated to produce a series of restart clocking signals;

and the clocking circuitry is responsive to the restart clocking signals for restarting the operation of the dynamic programmable logic arrays.

12. The combination of claim 11 wherein the restart circuitry includes circuitry for producing a reset signal for resetting the control circuitry to a starting condition.

13. The combination of claim 1 wherein:
the combination includes circuitry for temporarily suspending the operation of the control circuitry;
the combination includes refresh circuitry which is active during the suspension of the control circuitry operation for periodically supplying a sequence of refresh clocking signals to the clocking circuitry;
and the clocking circuitry is responsive to the refresh clocking signals for refreshing the signal conditions in the dynamic programmable logic arrays.

14. The combination of claim 13 wherein the refresh circuitry includes:
timeout counter circuitry for producing a timeout signal a predetermined time interval after the start of the suspension of the control circuitry operation and refresh clock counter circuitry responsive to the timeout signal for supplying a sequence of refresh clocking signals to the clocking circuitry and for supplying a restart signal to the timeout counter circuitry upon completion of the sequence of refresh clocking signals.

15. The combination of claim 1 wherein:
(1) each dynamic programmable logic array includes:
 (a) a set of AND array input lines,
 (b) a set of product lines,
 (c) a set of OR array output lines,
 (d) a set of AND array circuit elements for coupling some of the AND array input lines to some of the product lines to provide an input AND array,
 (e) a set of OR array circuit elements for coupling some of the product lines to some of the OR array output lines to provide an output OR array,
 (f) first dynamic operating circuitry responsive to a first clocking pulse for precharging the AND array input lines,
 (g) second dynamic operating circuitry responsive to a second clocking pulse for validating the AND array input lines and for precharging the product lines,
 (h) third dynamic operating circuitry responsive to a third clocking pulse for validating the product lines and for precharging the OR array output lines, and
 (i) fourth dynamic operating circuitry responsive to a fourth clocking pulse for validating the OR array output lines; and
(2) the clocking circuitry includes circuitry responsive to the strobe signals produced by the control circuitry for producing in a sequential manner first, second, third and fourth clocking pulses for each dynamic programmable logic array and for supplying same to the first, second, third and fourth dynamic operating circuitries, respectively, of the dynamic programmable logic arrays.

16. The combination of claim 15 wherein the clocking circuitry includes only combinatorial logic circuitry for producing the clocking pulses for the dynamic programmable logic arrays.

17. The combination of claim 16 wherein the clocking pulses for the different programmable logic arrays are overlapped so that the first clocking pulse for the second programmable logic array coincides with the second clocking pulse for the first programmable logic array, the first clocking pulse for the third programmable logic array coincides with the second clocking pulse for the second programmable logic array, and so forth.

18. The combination of claim 16 wherein: a first clocking pulse from the clocking circuitry is supplied to the first dynamic operating circuitry of a first programmable logic array; a second clocking pulse from the clocking circuitry is supplied to the second dynamic operating circuitry on the first programmable logic array and to the first dynamic operating circuitry of a second programmable logic array; a third clocking pulse from the clocking circuitry is supplied to the third dynamic operating circuitry of the first programmable logic array, the second dynamic operating circuitry of the second programmable logic array and the first dynamic operating circuitry of a third programmable logic array; a fourth clocking pulse from the clocking circuitry is supplied to the fourth dynamic operating circuitry of the first programmable logic array, the third dynamic operating circuitry of the second programmable logic array, the second dynamic operating circuitry of the third programmable logic array and the first dynamic operating circuitry of a fourth programmable logic array; a fifth clocking pulse from the clocking circuitry is supplied to the fourth dynamic operating circuitry of the second programmable logic array, the third dynamic operating circuitry of the third programmable logic array, the second dynamic operating circuitry of the fourth programmable logic array and the first dynamic operating circuitry of a fifth programmable logic array; and so forth.

19. In a microprogrammed data processor wherein a sequence of microwords are used to control the execution of each processor instruction, a control unit comprising:
a plurality of dynamic programmable logic arrays responsive to the processor instruction to be executed for individually producing different ones of the microwords needed to execute such instruction, each such microword including a strobe field which is coded to identify a programmable logic array other than the one which produced it;
control circuitry responsive to the microwords from the different programmable logic arrays for producing control point signals for controlling the operation of the data processor and including circuitry responsive to the strobe field in each microword for producing a strobe signal for selecting the next programmable logic array to supply a microword to the control circuitry;
and clocking circuitry responsive to the strobe signals produced by the control circuitry for producing clocking signals for the dynamic programmable logic arrays.

20. The combination of claim 19 wherein each dynamic programmable logic array includes an input AND array, an output OR array and multiple product lines interconnecting the AND and OR arrays.

21. The combination of claim 19 wherein each dynamic programmable logic array requires a plurality of successive clocking pulses in order to produce a valid microword and wherein the clocking circuitry is responsive to the strobe signals for producing the plurality of successive clocking pulses for each of the dynamic programmable logic arrays.

22. The combination of claim 19 wherein the clocking circuitry includes only combinatorial logic circuitry for producing the clocking signals for the dynamic programmable logic arrays.

* * * * *